US012813031B2

(12) United States Patent
Matsumoto et al.

(10) Patent No.: US 12,813,031 B2
(45) Date of Patent: Nov. 24, 2026

(54) LIGHT EMITTING DEVICE, LIGHT FIXTURE AND STREET LIGHT

(71) Applicant: NICHIA CORPORATION, Anan (JP)

(72) Inventors: Mika Matsumoto, Tokushima (JP); Takahito Miki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 487 days.

(21) Appl. No.: 18/557,287

(22) PCT Filed: Nov. 25, 2021

(86) PCT No.: PCT/JP2021/043142

§ 371 (c)(1),
(2) Date: Oct. 25, 2023

(87) PCT Pub. No.: WO2022/230223

PCT Pub. Date: Nov. 3, 2022

(65) Prior Publication Data

US 2024/0222573 A1 Jul. 4, 2024

(30) Foreign Application Priority Data

Apr. 26, 2021 (JP) ................................ 2021-074391

(51) Int. Cl.

| | |
|---|---|
| ***H10H 20/851*** | (2025.01) |
| ***A01M 29/10*** | (2011.01) |
| ***C09K 11/77*** | (2006.01) |

(52) U.S. Cl.

CPC ........ *H10H 20/8512* (2025.01); *A01M 29/10* (2013.01); *C09K 11/77347* (2021.01); *C09K 11/77348* (2021.01); *C09K 11/7774* (2013.01)

(58) Field of Classification Search

CPC ............. A01M 29/10; C09K 11/77347; C09K 11/77348; C09K 11/7774; C09K 11/617; H10H 20/8512; H10H 20/8513

See application file for complete search history.

(56) References Cited

U.S. PATENT DOCUMENTS

| | | | | |
|---|---|---|---|---|
| 7,927,512 | B2 | 4/2011 | Murazaki et al. | |
| 8,274,208 | B2 | 9/2012 | Miyake et al. | |
| 8,530,250 | B2 | 9/2013 | Ichikawa et al. | |
| 8,773,009 | B2 | 7/2014 | Aoki et al. | |
| 9,287,476 | B2 | 3/2016 | Ichikawa et al. | |
| 9,490,411 | B2 | 11/2016 | Ichikawa et al. | |
| 9,537,071 | B2 | 1/2017 | Ichikawa et al. | |
| 10,115,870 | B2 | 10/2018 | Ichikawa et al. | |
| 10,573,788 | B2 | 2/2020 | Ichikawa et al. | |
| 10,573,789 | B2 | 2/2020 | Ichikawa et al. | |
| 10,700,241 | B2 | 6/2020 | Ichikawa et al. | |
| 11,094,854 | B2 | 8/2021 | Ichikawa et al. | |
| 12,163,632 | B2 * | 12/2024 | Matsumoto | F21K 9/64 |
| 12,163,633 | B2 * | 12/2024 | Matsumoto | F21K 9/64 |
| 12,504,132 | B2 * | 12/2025 | Matsumoto | F21K 9/64 |
| 12,543,417 | B2 * | 2/2026 | Matsumoto | C09K 11/77342 |
| 2010/0208481 | A1 | 8/2010 | Miyake et al. | |
| 2010/0219746 | A1 | 9/2010 | Murazaki et al. | |
| 2011/0210354 | A1 | 9/2011 | Ichikawa et al. | |
| 2013/0169146 | A1 | 7/2013 | Aoki et al. | |
| 2014/0084320 | A1 | 3/2014 | Ichikawa et al. | |
| 2016/0049566 | A1 | 2/2016 | Ichikawa et al. | |
| 2016/0056357 | A1 | 2/2016 | Ichikawa et al. | |
| 2017/0141273 | A1 | 5/2017 | Ichikawa et al. | |
| 2018/0301600 | A1 | 10/2018 | Ichikawa et al. | |
| 2019/0035981 | A1 | 1/2019 | Ichikawa et al. | |
| 2019/0088825 | A1 | 3/2019 | Ichikawa et al. | |
| 2019/0093832 | A1 | 3/2019 | Soer et al. | |
| 2020/0287096 | A1 | 9/2020 | Ichikawa et al. | |
| 2021/0336094 | A1 | 10/2021 | Ichikawa et al. | |

FOREIGN PATENT DOCUMENTS

| | | | |
|---|---|---|---|
| CN | 111916547 | A | 11/2020 |
| JP | 2005093913 | A | 4/2005 |
| JP | 2009096883 | A | 5/2009 |
| JP | 2010062272 | A | 3/2010 |
| JP | 2013012778 | A | 1/2013 |
| JP | 2013026046 | A | 2/2013 |
| JP | 2013127928 | A | 6/2013 |
| JP | 2019207995 | A * | 12/2019 |
| JP | 2020057756 | A | 4/2020 |
| WO | 2007015542 | A1 | 2/2007 |

* cited by examiner

*Primary Examiner* — Anthony J Green

(74) *Attorney, Agent, or Firm* — Hunton Andrews Kurth LLP

(57) ABSTRACT

Provided is a light-emitting device, a light fixture, and a street light with a further reduced insect-attracting effect. A light-emitting device includes a light-emitting element having an emission peak wavelength within a range from 400 nm to 490 nm; and a first phosphor having an emission peak wavelength within a range from 570 nm to 680 nm, wherein the light-emitting device has a correlated color temperature of 1950 K or less, an average color rendering index Ra of 51 or greater, and a full width at half maximum of an emission peak having a maximum light emission intensity in an emission spectrum of the light-emitting device of 110 nm or less, and the light-emitting device emits light having an insect-attracting index I of 0.031 or less, which is a ratio of an effective radiance of the light-emitting device in consideration of spectral luminous efficiency of insects in a range from 250 nm to 615 nm to a luminance of light emitted by the light-emitting device in a range from 380 nm to 780 nm in consideration of spectral luminous efficiency for human photopic vision specified by the CIE (International Commission on Illumination).

20 Claims, 12 Drawing Sheets

LIGHT EMITTING DEVICE, LIGHT FIXTURE AND STREET LIGHT

CROSS-REFERENCE TO RELATED APPLICATION

This application is a national stage entry of International Application No. PCT/JP2021/043142, filed on Nov. 25, 2021, which claims priority to Japanese Patent Application No. 2021-074391, filed on Apr. 26, 2021, the disclosures of which are hereby incorporated by reference in their entireties.

TECHNICAL FIELD

The present invention relates to a light-emitting device, a light fixture, and a street light.

BACKGROUND ART

HID lamps, such as high-pressure mercury lamps, metal halide lamps, and high-pressure sodium lamps are often used as light sources for outdoor light fixtures, including street lights and road illumination lights, because they have a longer life and higher efficiency than incandescent lamps. Light sources using these lamps use mercury as the light-emitting material, and with the regulation of the Minamata Convention on Mercury, there is a demand for replacing these lamps with light fixtures that use safe light-emitting materials.

Reducing the effect of attracting insects of light fixtures used outdoors, such as street lights and road illumination lights, is also desired. Also, besides street lights and road illumination lights, reducing the effect of attracting insects of light fixtures used outdoors, such as headlights mountable to the head of a human, flashlights, and portable lanterns that use LEDs, and light fixtures used indoors but at locations near the outdoors, such as near entrances, exits, and windows, is desired. Many insects are attracted to light. The attraction of insects to light is caused by positive phototaxis in the insects, which is a behavior caused by the visual sensitivity (spectral luminous efficiency) of the insects. In the specification, the effect of attracting insects may be referred to as an "insect-attracting effect". The effect of reducing the insect-attracting effect of attracting insects may be referred to as a "reduced insect-attracting effect". Generally, insects have two spectral sensitivities bordering at a wavelength of approximately 400 nm, a wavelength region ranging from approximately 200 nm to approximately 400 nm and a wavelength region ranging from approximately 400 nm to approximately 600 nm. A light-emitting device is proposed that is provided with an optical multilayer film, a color filter, and a wavelength cut filter for controlling the transmission of light in a predetermined wavelength region in order to control energy intensity in a wavelength region of spectral luminous efficiency of such insects. For example, in Patent Documents 1 and 2, a light-emitting device is described that includes an optical multilayer film and controls energy intensity in a wavelength region of spectral luminous efficiency of insects.

CITATION LIST

Patent Literature

Patent Document 1: JP 2013-26046 A
Patent Document 2: JP 2013-127928 A

SUMMARY OF INVENTION

Technical Problem

An optical multilayer film causes light interference at an interface between layers having different refractive indices and thus has incident angle dependence. For example, with the spectral distribution of light incident obliquely to the optical multilayer film, the effect of controlling the transmission of light in a predetermined wavelength region is small, and the reduced insect-attracting effect may not be sufficiently obtained.

An object of an aspect of the present invention is to provide a light-emitting device, a light fixture, and a street light with a reduced insect-attracting effect.

Solution to Problem

A light-emitting device according to a first aspect includes: a light-emitting element having an emission peak wavelength within a range from 400 nm to 490 nm; and a first phosphor having an emission peak wavelength within a range from 570 nm to 680 nm, wherein the light-emitting device has a correlated color temperature of 1950 K or less, an average color rendering index Ra of 51 or greater, and a full width at half maximum of an emission peak having a maximum light emission intensity in an emission spectrum of 110 nm or less, and emits light having an insect-attracting index I derived from Equation (1) of 0.031 or less, the insect-attracting index I being a ratio of an effective radiance of the light-emitting device in consideration of spectral luminous efficiency of insects in a range from 250 nm to 615 nm to a luminance of light emitted by the light-emitting device in a range from 380 nm to 780 nm in consideration of spectral luminous efficiency for human photopic vision specified by the CIE (International Commission on Illumination).

[Math. 1]

$$I = \frac{\int_{250}^{615} S(\lambda) \times R(\lambda) d\lambda}{\int_{380}^{780} S(\lambda) \times V(\lambda) d\lambda} \quad (1)$$

(where $S(\lambda)$ is a spectral radiance of light emitted by the light-emitting device, $V(\lambda)$ is the spectral luminous efficiency function for human photopic vision specified by the CIE (International Commission on Illumination), and $R(\lambda)$ is a spectral luminous efficiency of insects).

A light-emitting device according to a second aspect includes: a light-emitting element having an emission peak wavelength within a range from 400 nm to 490 nm; and a first phosphor having an emission peak wavelength within a range from 570 nm to 680 nm, wherein the first phosphor includes a first nitride phosphor having a composition represented by Formula (1A), the light-emitting device has a correlated color temperature of 1950 K or less and a full width at half maximum of an emission peak having a maximum light emission intensity in an emission spectrum of 110 nm or less, and emits light having an insect-attracting index I derived from Equation (1) of 0.031 or less, the insect-attracting index I being a ratio of an effective radiance of the light-emitting device in consideration of spectral luminous efficiency of insects in a range from 250 nm to 615 nm to a luminance of light emitted by the light-emitting device in a range from 380 nm to 780 nm in consideration of spectral luminous efficiency for human photopic vision specified by the CIE (International Commission on Illumination).

$$M^1{}_2Si_5N_8:Eu \quad (1A)$$

(where $M^1$ is an alkaline earth metal element including at least one selected from the group consisting of Ca, Sr, and Ba).

A third aspect is a light fixture including the light-emitting device.

A fourth aspect is a street light including the light-emitting device.

Advantageous Effects of Invention

According to an aspect of the present invention, a light-emitting device, a light fixture, and a street light with a reduced insect-attracting effect can be provided.

DESCRIPTION OF EMBODIMENTS

Figure 1A:
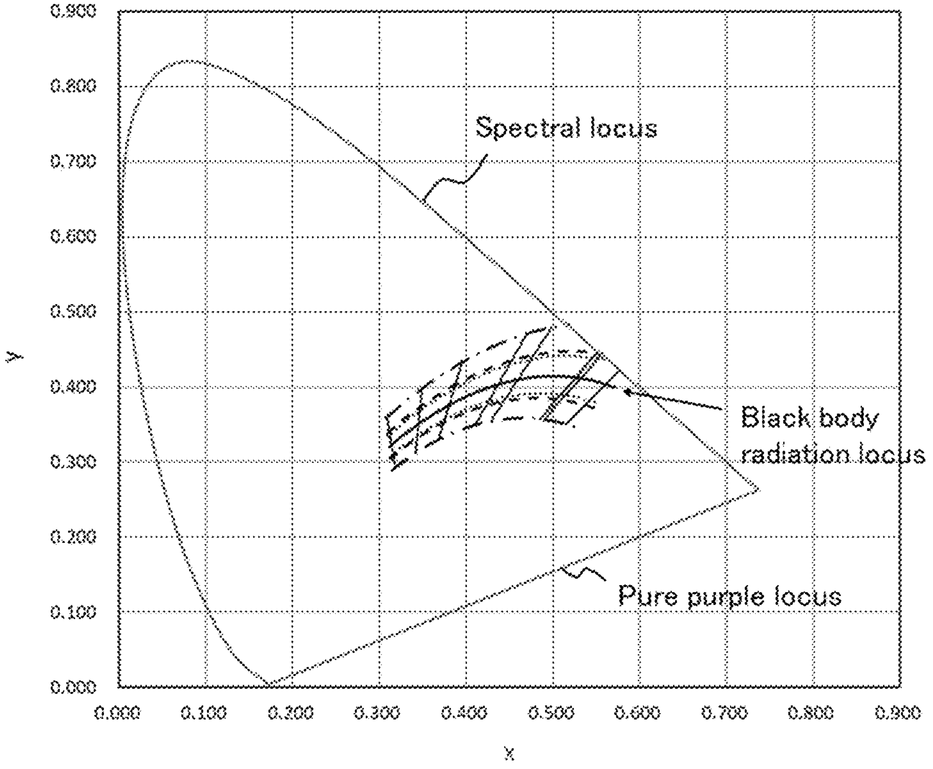
FIG. 1A is a CIE 1931 chromaticity diagram illustrating a black body radiation locus (Duv: 0.000) within the spectral locus and pure purple locus on the CIE 1931 chromaticity diagram and color deviations from the black body radiation locus.

Embodiments of the present invention will be described below with reference to the drawings. However, the embodiments to be illustrated below are examples for embodying a technical concept of the present invention, and the present invention is not limited to the following light-emitting device, light fixture, and street light. Also, the members in the claims are not in any way limited to the members in the embodiments. In addition, dimensions, materials, shapes, relative arrangements, and the like of the components described in the embodiments are not intended to limit the scope of the present invention thereto, unless otherwise specified, and are merely exemplary. Note that the relationship between the color name and the chromaticity coordinates, and the relationship between the wavelength range of light and the color name of monochromatic light, and the like conform to JIS Z 8110. In the present specification, if a plurality of substances applicable to each component in a composition are present, the content of each component in the composition means the total amount of the plurality of substances present in the composition, unless otherwise specified. The full width at half maximum means a wavelength width of an emission peak at which a light emission intensity of 50% of the maximum light emission intensity is exhibited in the emission spectrum.

A light-emitting device according to a first embodiment includes a light-emitting element with an emission peak wavelength within a range from 400 nm to 490 nm and a first phosphor with an emission peak wavelength within a range from 570 nm to 680 nm. The light-emitting device has a Correlated Color Temperature (CCT) of 1950 K or less, an average color rendering index Ra of 51 or greater, and a full width at half maximum of an emission peak having the maximum light emission intensity in an emission spectrum of the light-emitting device of 110 nm or less. In addition, the light-emitting device emits light having an insect-attracting index I derived from the following Equation (1) of 0.031 or less, which is a ratio of the effective radiance of the light-emitting device in consideration of the spectral luminous efficiency of insects in a range from 250 nm to 615 nm to luminance of light emitted by the light-emitting device in a range from 380 nm to 780 nm in consideration of spectral luminous efficiency for human photopic vision specified by the CIE (International Commission on Illumination).

[Math. 2]

$$I = \frac{\int_{250}^{615} S(\lambda) \times R(\lambda) d\lambda}{\int_{380}^{780} S(\lambda) \times V(\lambda) d\lambda} \quad (1)$$

(where $S(\lambda)$ is a spectral radiance of light emitted by the light-emitting device, $V(\lambda)$ is the spectral luminous efficiency function for human photopic vision specified by the CIE (International Commission on Illumination), and $R(\lambda)$ is a spectral luminous efficiency of insects).

A light-emitting device according to a second embodiment includes a light-emitting element having an emission peak wavelength within a range from 400 nm to 490 nm and a first phosphor having an emission peak wavelength within a range from 570 nm to 680 nm. The first phosphor includes a first nitride phosphor having a composition represented by Formula (1A) described later, and the light-emitting device has a correlated color temperature of 1950 K or less, and has a full width at half maximum of an emission peak having the maximum light emission intensity in the emission spectrum of 110 nm or less. In addition, the light-emitting device emits light having the insect-attracting index I derived from Equation (1) of 0.031 or less, which is a ratio of the effective radiance of the light-emitting device in consideration of the spectral luminous efficiency of insects in a range from 250 nm to 615 nm to the luminance of light emitted by the light-emitting device in a range from 380 nm to 780 nm in consideration of spectral luminous efficiency for human photopic vision specified by the CIE (International Commission on Illumination).

[Math. 3]

$$I = \frac{\int_{250}^{615} S(\lambda) \times R(\lambda) d\lambda}{\int_{380}^{780} S(\lambda) \times V(\lambda) d\lambda} \quad (1)$$

(where $S(\lambda)$ is a spectral radiance of light emitted by the light-emitting device, $V(\lambda)$ is the spectral luminous efficiency function for human photopic vision specified by the CIE (International Commission on Illumination), and $R(\lambda)$ is a spectral luminous efficiency of insects).

High-pressure sodium lamps used as light sources in outdoor light fixtures, such as street lights and road illumination lights, have a correlated color temperature in a range from approximately 2000 K to 2500 K according to catalog values and emit light having a large amount of yellow to orange components. When the amount of light with a blue component and/or a green component included in the mixed color light increases, the spectral region overlapping with the spectral luminous efficiency at which the insects exhibit positive phototaxis increases, making the insects more easily attracted and tending to increase the insect-attracting effect. Examples of the insects include insects of the subclass Pterygota having wings, insects of the subclass Apterygota having no wings, and the like. Examples of the insects of the subclass Pterygota include Hemiptera, such as *Nephotettix cincticeps*, and Lepidoptera, such as butterflies and moths.

The light-emitting device emits light having a correlated color temperature of 1950 K or less. The light-emitting device emits light having a correlated color temperature that is substantially equal to or slightly lower than that of light emitted by a high-pressure sodium lamp, for example. When the correlated color temperature of the light emitted by the light-emitting device is 1950 K or less, the light-emitting device, although used as a light source of a light fixture such as a street light or a road illumination light using a high-pressure sodium lamp as a light source, emits light that does not cause discomfort. The correlated color temperature of the light emitted by the light-emitting device may be 1920 K or less or 1900 K or less. The correlated color temperature of the light emitted by the light-emitting device is preferably 1000 K or greater and may be 1200 K or greater, 1500 K or greater, or 1700 K or greater in order to prevent discomfort in humans from light emitted from, for example, a light-emitting device used outdoors or a light-emitting device used indoors but at a location near the outdoors.

The average color rendering index Ra of the light emitted by the light-emitting device is 5 or greater, may be 10 or greater, 20 or greater, 30 or greater, or 40 or greater, is preferably 51 or greater, and is more preferably 62 or greater. The average color rendering index of the light emitted by the light-emitting device can be measured in accordance with JIS Z8726. As the value of the average color rendering index Ra of the light emitted by the light-emitting device approaches 100, the color rendering property comes closer to that of the reference light source. The color rendering property represents how well an irradiated object is revealed. It is sufficient that an outdoor light fixture such as a street light or a road illumination light emits light having an average color rendering index Ra of 5 or greater.

A special color rendering index R9 of light emitted by the light-emitting device is an index for evaluating red color. In many cases, there is little need to confirm the red color of a light-emitting device used outdoors such as a street light or a road illumination light or used indoors but at a location near the outdoors. The special color rendering index R9 of the light emitted by the light-emitting device may be a negative numerical value. The special color rendering index R9 of the light emitted by the light-emitting device may be within a range of minus (−) 150 to plus (+) 99, within a range of −140 to +98, or within a range of −135 to +95.

With the light-emitting device, the full width at half maximum of the emission peak having the maximum light emission intensity in the emission spectrum of the light-emitting device is 110 nm or less and may be 100 nm or less, 95 nm or less, 90 nm or less, and 3 nm or greater, 40 nm or greater, 60 nm or greater, or 70 nm or greater. In the emission spectrum of the light-emitting device, when the full width at half maximum of the emission peak having the maximum light emission intensity is large, there is a tendency that the light components on the long wavelength side which are difficult for humans to perceive increase or the light components on the short wavelength side which are easy for insects to perceive increase. When the light components on the long wavelength side increase, the luminance of the light emitted by the light-emitting device tends to decrease. When the light components on the short wavelength side increase, the possibility of attracting insects tends to increase. In addition, in the emission spectrum of the light-emitting device, when the full width at half maximum of the emission peak having the maximum light emission intensity is small, the light components in a specific wavelength range tend to increase. In the case in which the emission peak having the maximum light emission intensity is on the short wavelength side in the emission spectrum of the light-emitting device, light emission on the short wavelength side having a large effect on insects from the light-emitting device is not suppressed, making it difficult to reduce the effect of attracting insects. Also, in the emission spectrum of the light-emitting device, when the emission peak having the maximum light emission intensity is on the long wavelength side and the light components on the long wavelength side which are difficult for humans to perceive increase, it becomes difficult to suppress a decrease in luminance. For example, in order to provide a light-emitting device which has a reduced insect-attracting effect required for a light-emitting device used outdoors or a light-emitting device used indoors but at a location near the outdoors and that emits light with a high efficiency, the light-emitting device preferably has a full width at half maximum of an emission peak having the maximum light emission intensity in the emission spectrum of 110 nm or less.

The full width at half maximum of the emission peak having the maximum light emission intensity in the emission spectrum of the light-emitting device may be narrower than the full width at half maximum of the emission peak having the emission peak wavelength of the first phosphor or the full width at half maximum of the emission peak having the emission peak wavelength of a second phosphor included in the light-emitting device. For example, in a case in which the first phosphor and the second phosphor having emission peak wavelengths in different wavelength ranges are included, the light emission intensity changes in a region where the emission spectrum of the first phosphor and the emission spectrum of the second phosphor overlap. As a result, the emission spectrum of the mixed color light emitted by the light-emitting device is different from the emission spectrum of the first phosphor or the emission spectrum of the second phosphor, and the full width at half maximum thereof may be narrower than the full width at half maximum of the emission peak having the emission peak wavelength of the first phosphor or the full width at half maximum of the emission peak having the emission peak wavelength of the second phosphor.

In the light-emitting device, the emission peak wavelength having the maximum light emission intensity in the emission spectrum is preferably within a range from 570 nm to 680 nm and may be within a range from 575 nm to 680 nm or within a range from 575 nm to 670 nm. The range of the emission peak wavelength having the maximum light emission intensity in the emission spectrum of the light-emitting device may overlap with the range of the emission peak wavelength of the first phosphor. The emission peak having the maximum light emission intensity in the emission spectrum of the light-emitting device may be derived from the light emission of the first phosphor.

The light-emitting device emits light having an insect-attracting index I derived from Equation (1) of 0.031 or less. The insect-attracting index I is a ratio of an effective radiance Li of the light-emitting device in consideration of the spectral luminous efficiency (Bickford data, hereinafter also referred to as "Bickford") of insects in a range from 250 nm to 615 nm to a luminance L of the light-emitting device in a range from 380 nm to 780 nm in consideration of the spectral luminous efficiency for human photopic vision as specified by the CIE. The insect-attracting index I represents a ratio of the effective radiance of the light-emitting device acting on the positive phototaxis of insects to the luminance of the light emitted by the light-emitting device. The smaller the value of the insect-attracting index I is, the more the light emission for which the insects exhibit positive phototaxis is suppressed with respect to the luminance of the light emitted by light-emitting device.

The light-emitting device includes a light-emitting element having an emission peak wavelength within a range from 400 nm to 490 nm, has an insect-attracting index I of 0.031 or less even when blue component light emitted from the light-emitting element is included, and has a further reduced insect-attracting effect. When the light-emitting device emits light having an insect-attracting index I of 0.031 or less, the spectral radiance of the light-emitting device in a wavelength range from 400 nm to 615 nm, which overlaps the spectral luminous efficiency of insects, is reduced, and in particular, the spectral radiance of the light-emitting device in a wavelength range from 400 nm to 550 nm is reduced, so that light having a further reduced insect-attracting effect can be emitted. By reducing the spectral radiance within the wavelength range from greater 400 nm to 550 nm, light having a reduced insect-attracting effect is emitted from the light-emitting device. By suppressing the reduction in the spectral radiance in a range from 550 nm to 600 nm, light with a suppressed decrease in luminance is emitted from the light-emitting device. When the insect-attracting index I of the light emitted by light-emitting device is 0.031 or less, a sufficient reduced insect-attracting effect is obtained, but the insect-attracting index I may be 0.028 or less or may be 0.025 or less. In consideration of the spectral luminous efficiency of insects, the light-emitting device may emit light having an insect-attracting index I of 0.001 or greater, 0.005 or greater, or 0.012 or greater.

The luminance L of the light-emitting device in a range from 380 nm to 780 nm is derived from the following Equation (2). The luminance L of the light-emitting device is an integrated value of the spectral radiance S(λ) of the light-emitting device in a range from 380 nm to 780 nm and the spectral luminous efficiency function V(λ) for human photopic vision specified by the CIE.

[Math. 4]

$$L = \int_{380}^{780} S(\lambda) \times V(\lambda) d\lambda \tag{2}$$

The effective radiance Li of the light-emitting device in consideration of the spectral luminous efficiency of insects in a range from 250 nm to 615 nm is derived from the following Equation (3). The effective radiance Li of the light-emitting device in consideration of the spectral luminous efficiency of insects is an integrated value of the spectral radiance S(λ) of the light-emitting device in a range from 250 nm to 615 nm and the spectral luminous efficiency (Bickford) R(λ) of insects.

[Math. 5]

$$Li = \int_{250}^{615} S(\lambda) \times R(\lambda) d\lambda \tag{3}$$

The insect-attracting index I derived from Equation (1) is a ratio (I=Li/L) of the effective radiance Li of the light-emitting device derived from Equation (3) to the luminance L of the light-emitting device in a range of 380 nm to 780 nm derived from Equation (2).

Light-Emitting Element

The light-emitting element has an emission peak wavelength within a range from 400 nm to 490 nm. The emission peak wavelengths of the light-emitting element is preferably within a range from 420 nm to 480 nm and may be within a range from 440 nm to 460 nm, in order to emit light having a correlated color temperature that does not cause discomfort when illuminating outdoors, satisfying a color rendering property required for light to illuminate outdoors, and having a reduced insect-attracting effect. At least a part of the light emitted by the light-emitting element is used as excitation light for the first phosphor, and when the second phosphor is included, the light is used as excitation light for the second phosphor. In addition, a part of light emitted by the light-emitting element is used as light emitted from the light-emitting device. The full width at half maximum of the emission peak having an emission peak wavelength in the emission spectrum of the light-emitting element is preferably 30 nm or less, more preferably 25 nm or less, and even more preferably 20 nm or less. As the light-emitting element, for example, a semiconductor light-emitting element that uses a nitride-based semiconductor is preferably used. Accordingly, it is possible to achieve a stable light-emitting device that exhibits high efficiency and high output linearity with respect to an input and that is strong against mechanical impact. The light-emitting element is provided with a p-electrode and an n-electrode. The p-electrode and the n-electrode of the light-emitting element may be formed on a surface on the same side of the light-emitting element or may be formed on surfaces on different sides.

First Phosphor

The light-emitting device includes the first phosphor having an emission peak wavelength within a range from 570 nm to 680 nm. The first phosphor emits light having an emission peak wavelength within a range from 570 nm to 680 nm when excited by light emitted by a light-emitting element having an emission peak wavelength in a range from 400 nm to 490 nm. The first phosphor may have an emission peak wavelength within a range from 575 nm to 670 nm or may have an emission peak wavelength within a range from 580 nm to 660 nm. For the first phosphor, the full width at half maximum of the emission peak having an emission peak wavelength in the emission spectrum of the first phosphor is preferably within a range from 3 nm to 120 nm. The full width at half maximum of the emission peak having an emission peak wavelength in the emission spectrum of the first phosphor is preferably within a range from 3 nm to 15 nm or within a range from 60 nm to 120 nm. Preferably, in order for a light-emitting device used outdoors or a light-emitting device used indoors but at a location near the outdoors to emit light having a correlated color temperature that does not cause discomfort, satisfying the color rendering property required for a light-emitting device used outdoors or a light-emitting device used indoors but at a location near the outdoors, and having a reduced insect-attracting effect, the full width at half maximum of the emission peak having an emission peak wavelength in the emission spectrum of the first phosphor is preferably within the range described above.

To achieve the emission spectrum described above, the first phosphor preferably includes at least one selected from the group consisting of a first nitride phosphor having a composition represented by Formula (1A), a second nitride phosphor having a composition represented by Formula (1B), a fluoride phosphor represented by Formula (1C), and a fluoride phosphor represented by Formula (1C') with a different composition to that represented by Formula (1C).

$$M^1_2Si_5N_8{:}Eu \quad (1A)$$

(where $M^1$ is an alkaline earth metal element including at least one selected from the group consisting of Ca, Sr, and Ba).

$$Sr_qCa_sAl_tSi_uN_v{:}Eu \quad (1B)$$

(where q, s, t, u, and v satisfy $0 \le q < 1$, $0 < s \le 1$, $q+s \le 1$, $0.9 \le t \le 1.1$, $0.9 \le u \le 1.1$, and $2.5 \le v \le 3.5$).

$$A_c[M^2_{1-b}Mn^{4+}_bF_d] \quad (1C)$$

(where A includes at least one selected from the group consisting of $K^+$, $Li^+$, $Na^+$, $Rb^+$, $Cs^+$, and $NH_4^+$, and among these, $K^+$ is preferable. $M^2$ includes at least one element selected from the group consisting of group 4 elements and group 14 elements, and among these, Si and Ge are preferable. b satisfies $0<b<0.2$, c is an absolute value of electric charge of $[M^2_{1-b}Mn^{4+}_bF_d]$ ion, d satisfies $5<d<7$).

$$A'_{c'}[M^{2'}_{1-b'}Mn^{4+}_{b'}F_{d'}] \quad (1C')$$

(where A' includes at least one selected from the group consisting of $K^+$, $Li^+$, $Na^+$, $Rb^+$, $Cs^+$, and $NH_4^+$, and among these, $K^+$ is preferable. $M^{2'}$ includes at least one element selected from the group consisting of group 4 elements, group 13 elements, and group 14 elements, and among these, Si and Al are preferable. b' satisfies $0<b'<0.2$, c' is an absolute value of electric charge of $[M^{2'}_{1-b'}Mn^{4+}_{b'}F_{d'}]$ ion, and d' satisfies $5<d'<7$).

In the present specification, in the formulae representing the compositions of the phosphors, the characters preceding the colon (:) represent a mole ratio for elements in one mole of composition of a host crystal and a phosphor, and the characters following the colon (:) represent an activating element.

The first phosphor may include at least one phosphor selected from the group consisting of a fluorogermanate phosphor, a fourth nitride phosphor, and a first sulfide phosphor. The fluorogermanate phosphor has a composition represented by the following Formula (1D), for example. The fourth nitride phosphor has a composition represented by the following Formula (1E), for example. The first sulfide phosphor has a composition represented by the following Formula (1F), for example.

$$(i-j)MgO \cdot (j/2)Sc_2O_3 \cdot kMgF_2 \cdot mCaF_2 \cdot (1-n)GeO_2 \cdot (n/2)M^3_2O_3{:}Mn \quad (1D)$$

(where $M^3$ is at least one selected from the group consisting of Al, Ga, and In). i, j, k, m, n, and z may each satisfy $2 \le i \le 4$, $0 \le j \le 0.5$, $0<k<1.5$, $0 \le m<1.5$, and $0 \le n<0.5$.

$$M^4_{v2}M^5_{w2}Al_{3-y2}Si_{y2}N_{z2}{:}M^6 \quad (1E)$$

(where $M^4$ is at least one element selected from the group consisting of Ca, Sr, Ba, and Mg; $M^5$ is at least one element selected from the group consisting of Li, Na, and K; $M^6$ is at least one element selected from the group consisting of Eu, Ce, Tb, and Mn; and v2, w2, y2, and z2 each satisfy $0.80 \leq v2 \leq 1.05$, $0.80 \leq w2 \leq 1.05$, $0 \leq y2 \leq 0.5$, and $3.0 \leq z2 \leq 5.0$.

$$(Ca, Sr)S:Eu \tag{1F}$$

In the present specification, a plurality of elements separated by commas (,) in a formula representing the composition of the phosphor may mean that at least one element among the plurality of elements is included in the composition and may mean that a combination of two or more among the plurality of elements is included.

The fluorogermanate phosphor having the composition represented by Formula (1D) may have a composition represented by the following Formula (1d), for example.

$$3.5\ MgO \cdot 0.5\ MgF_2 \cdot GeO_2:Mn \tag{1d}$$

The fourth nitride phosphor having the composition represented by Formula (1E) may have a composition represented by the following Formula (1e).

$$M^4_{v2}M^5_{w2}M^6_{x2}Al_{3-y2}Si_{y2}N_{z2} \tag{1e}$$

(where $M^4$, $M^5$, and $M^6$ have the same meaning as $M^4$, $M^5$, and $M^6$ in Formula (1E), v2, w2, y2, and z2 have the same meanings as v2, w2, y2, and z2 in Formula (1E), and x2 satisfies $0.001 < x2 \leq 0.1$).

The fluorogermanate phosphor, the fourth nitride phosphor, and the first sulfide phosphor have emission peak wavelengths within a range from 570 nm to 680 nm and preferably have emission peak wavelengths within a range from 600 nm to 630 nm. The fluorogermanate phosphor, the fourth nitride phosphor, and the first sulfide phosphor each have a full width at half maximum of the emission peak having an emission peak wavelength in the emission spectrum of the first phosphor in a range from 5 nm to 100 nm and preferably in a range from 6 nm to 90 nm.

The light-emitting device of the first embodiment may include at least one type of the first phosphor alone or may include two or more types of the first phosphor. Since the first phosphor is included, when the light-emitting device is mounted outdoors, the light-emitting device can emit a light that has a correlated color temperature of 1950 K or less that does not cause discomfort, an average color rendering index Ra of 51 or greater for the color rendering property required for a light-emitting device used outdoors or a light-emitting device used indoors but at a location near the outdoors, a full width at half maximum of the emission peak having the maximum light emission intensity in the emission spectrum of the light-emitting device of 110 nm or less, and the reduced insect-attracting effect with the insect-attracting index I of 0.031 or less.

A light-emitting device of a second embodiment essentially includes, as the first phosphor, the first nitride phosphor having the composition represented by Formula (1A). By including the first nitride phosphor having the composition represented by Formula (1A) as the first phosphor, the light-emitting device can emit light from the light-emitting element having an emission peak wavelength within a range from 400 nm to 490 nm and emit light, from the first phosphor including the first nitride phosphor, having a correlated color temperature of 1950 K or less, a full width at half maximum of the emission peak having the maximum light emission intensity in the emission spectrum of the light-emitting device of 110 nm or less, and the reduced insect-attracting effect with the insect-attracting index I of 0.031 or less. The light-emitting device of the second embodiment essentially includes, as the first phosphor, the first phosphor having the composition represented by Formula (1A) and may include at least one selected from the group consisting of the second nitride phosphor having the composition represented by Formula (1B), the fluoride phosphor having the composition represented by Formula (1C), and the fluoride phosphor having the composition represented by Formula (1C'). Also, the light-emitting device of the second embodiment essentially includes, as the first phosphor, the first nitride phosphor having the composition represented by Formula (1A) and may include at least one phosphor selected from the group consisting of the second nitride phosphor having the composition represented by Formula (1B), the fluoride phosphor represented by Formula (1C), the fluoride phosphor represented by Formula (1C'), the fluorogermanate phosphor having the composition represented by Formula (1D), the fourth nitride phosphor having the composition represented by Formula (1E), and a first sulfide phosphor represented by Formula (1F).

The light-emitting device of the second embodiment essentially includes, as the first phosphor, the first nitride phosphor having the composition represented by Formula (1A) and may include at least one phosphor selected from the group consisting of the fluorogermanate phosphor having the composition represented by Formula (1D), the fourth nitride phosphor having the composition represented by Formula (1E), and the first sulfide phosphor represented by Formula (1F).

In a case in which, as the first phosphor, the first nitride phosphor having the composition represented by Formula (1A) is essentially included, all of the first phosphor may be the first nitride phosphor. In a case in which, as the first phosphor, the first nitride phosphor having the composition represented by Formula (1A) is essentially included and a first phosphor other than the first nitride phosphor having the composition represented by Formula (1A) is included, the mass ratio (first nitride phosphor/first phosphor other than the first nitride phosphor) between the first nitride phosphor and the first phosphor other than the first nitride phosphor blended in the first phosphor may be in a range from 99/1 to 1/99, a range from 98/2 to 10/90, or a range from 95/5 to 30/70. The first phosphor other than the first nitride phosphor having the composition represented by Formula (1A) corresponds to at least one phosphor selected from the group consisting of the second nitride phosphor having the composition represented by Formula (1B), the fluoride phosphor represented by Formula (1C), the fluoride phosphor represented by Formula (1C'), the fluorogermanate phosphor having the composition represented by Formula (1D), the fourth nitride phosphor having the composition represented by Formula (1E), and the first sulfide phosphor represented by Formula (1F).

The content of the first phosphor included in the light-emitting device varies depending on the form and the like of the light-emitting device. In a case in which a wavelength conversion member of the light-emitting device includes the first phosphor, the wavelength conversion member preferably includes phosphors and a light transmissive material. The wavelength conversion member may include a wavelength conversion body including phosphors and a light transmissive material. The total amount of the phosphors included in the wavelength conversion member may be within a range from 10 parts by mass to 900 parts by mass, within a range from 15 parts by mass to 850 parts by mass, or within a range from 20 parts by mass to 800 parts by mass relative to 100 parts by mass of the light transmissive material. The total amount of the phosphors refers to the total amount of the first phosphor in a case in which the light-emitting device includes only the first phosphor and does not include a phosphor other than the first phosphor. The total amount of the phosphors refers to the total amount of the first phosphor and the second phosphor in a case in which the light-emitting device includes the first phosphor and the second phosphor.

In a case in which the light-emitting device includes the second phosphor described below, the content of the first phosphor included in the light-emitting device is preferably within a range from 5 mass % to 95 mass % with respect to the total amount of the first phosphor and the second phosphor. When the content of the first phosphor included in the light-emitting device is within a range from 5 mass % to 95 mass % with respect to the total amount of the first phosphor and the second phosphor, the light-emitting device can emit light having a correlated color temperature of 1950 K or less, a full width at half maximum of the emission peak having the maximum light emission intensity in the emission spectrum of the light-emitting device of 110 nm or less, and the reduced insect-attracting effect with the insect-attracting index I of 0.031 or less. The content of the first phosphor included in the light-emitting device may be within a range from 8 mass % to 80 mass %, a range from 10 mass % to 70 mass %, or a range from 11 mass % to 60 mass % with respect to the total amount of the first phosphor and the second phosphor.

Second Phosphor

The light-emitting device preferably includes the second phosphor having an emission peak wavelength within a range from 480 nm to less than 570 nm. The second phosphor emits light having an emission peak wavelength within a range from 480 nm to less than 570 nm when excited by light emitted by a light-emitting element having an emission peak wavelength in a range from 400 nm to 490 nm. The second phosphor, when excited by the light-emitting element, may have an emission peak wavelength within a range from 490 nm to 565 nm or may have an emission peak wavelength within a range from 495 nm to 560 nm. The second phosphor has a full width at half maximum of the emission peak having an emission peak wavelength in the emission spectrum of the second phosphor preferably within a range from 20 nm to 125 nm, and the full width at half maximum may be within a range from 25 nm to 124 nm or within a range from 30 nm to 123 nm. Preferably, in order for a light-emitting device used outdoors or a light-emitting device used indoors but at a location near the outdoors to emit light having a correlated color temperature that does not cause discomfort, satisfying the color rendering property required for a light-emitting device used outdoors or a light-emitting device used indoors but at a location near the outdoors, and having the reduced insect-attracting effect, the full width at half maximum of the emission peak having an emission peak wavelength in the emission spectrum of the second phosphor is preferably within the range described above.

It is preferable that the second phosphor includes at least one selected from the group consisting of a rare earth aluminate phosphor having a composition represented by Formula (2A) and a third nitride phosphor having a composition represented by Formula (2B) to achieve the emission spectrum described above.

$$Ln^1_3(Al_{1-a}Ga_a)_5O_{12}:Ce \quad (2A)$$

(where $Ln^1$ is at least one element selected from the group consisting of Y, Gd, Tb, and Lu, and a satisfies $0 \le a \le 0.5$).

$$La_wLn^2_xSi_6N_y:Ce_z \quad (2B)$$

(where $Ln^2$ essentially includes at least one selected from the group consisting of Y and Gd and may include at least one selected from the group consisting of Sc and Lu, and when the $Ln^2$ element included in 1 mol of the composition is 100 mol %, the total of Y and Gd included in $Ln^2$ is 90 mol % or greater, and w, x, y, and z satisfy $1.2 \le w \le 2.2$, $0.5 \le x \le 1.2$, $10 \le y \le 12.0$, $0.5 \le z \le 1.2$, $1.80 \le w+x < 2.40$, and $2.9 \le w+x+z \le 3.1$).

In the rare earth aluminate phosphor having the composition represented by Formula (2A) and the third nitride phosphor having the composition represented by Formula (2B), the full width at half maximum of the emission peak having an emission peak wavelength in the emission spectrum of the phosphor is, for example, 90 nm or greater, preferably 100 nm or greater, and more preferably 110 nm or greater and, for example, 125 nm or less, preferably 124 nm or less, and more preferably 123 nm or less.

The second phosphor may include at least one phosphor selected from the group consisting of an alkaline earth metal aluminate phosphor and an alkaline earth metal halosilicate phosphor. The alkaline earth metal aluminate phosphor is, for example, a phosphor including at least strontium and activated with europium and has a composition represented by, for example, the following Formula (2C). Also, the alkaline earth metal halosilicate phosphor is, for example, a phosphor including at least calcium and chlorine and activated with europium and has a composition represented by, for example, the following Formula (2D).

$$Sr_4Al_{14}O_{25}:Eu \quad (2C)$$

$$(Ca, Sr, Ba)_8MgSi_4O_{16}(F, Cl, Br)_2:Eu \quad (2D)$$

where Sr may be partially substituted with at least one element selected from the group consisting of Mg, Ca, Ba, and Zn.

The alkaline earth metal aluminate phosphor having the composition represented by Formula (2C) and the alkaline earth metal halosilicate phosphor having the composition represented by Formula (2D) have emission peak wavelengths within a range from 480 nm to less than 520 nm and preferably have emission peak wavelengths within a range from 485 nm to 515 nm.

In the alkaline earth metal aluminate phosphor having the composition represented by Formula (2C) and the alkaline earth metal halosilicate phosphor having the composition represented by Formula (2D), the full width at half maximum of the emission peak having an emission peak wavelength in the emission spectrum of the phosphor is, for example, 30 nm or greater, preferably 40 nm or greater, and more preferably 50 nm or greater and, for example, 80 nm or less and preferably 70 nm or less.

The second phosphor may include at least one phosphor selected from the group consisting of a β-SiAlON phosphor, a second sulfide phosphor, a scandium-based phosphor, and an alkaline earth metal silicate-based phosphor. The β-SiAlON phosphor has a composition represented by the following Formula (2E), for example. The second sulfide phosphor has a composition represented by the following Formula (2F), for example. The scandium-based phosphor has a composition represented by the following Formula (2G), for example. The alkaline earth metal silicate-based phosphor has, for example, a composition represented by the following Formula (2H) or a composition represented by the following Formula (2J).

$$Si_{6-g}Al_gO_gN_{8-g}:Eu(0 < g \leq 4.2) \quad (2E)$$

$$(Sr, M^7)Ga_2S_4:Eu \quad (2F)$$

(where $M^7$ represents at least one element selected from the group consisting of Be, Mg, Ca, Ba, and Zn).

$$(Ca, Sr)Sc_2O_4:Ce \quad (2G)$$

$$(Ca, Sr)_3(Sc, Mg)_2Si_3O_{12}:Ce \quad (2H)$$

$$(Ca, Sr, Ba)_2SiO_4:Eu \quad (2J)$$

The β-SiAlON phosphor, the second sulfide phosphor, the scandium-based phosphor, and the alkaline earth metal silicate-based phosphor have emission peak wavelengths within a range from 520 nm to less than 580 nm and preferably have emission peak wavelengths within a range from 525 nm to 565 nm. In the β-SiAlON phosphor, the second sulfide phosphor, the scandium-based phosphor, and the alkaline earth metal silicate-based phosphor, the full width at half maximum of the emission peak having an emission peak wavelength in the emission spectrum of the second phosphor is, for example, 20 nm or greater and preferably 30 nm or greater and, for example, 120 nm or less and preferably 115 nm or less.

The second phosphor may include at least one phosphor selected from the group consisting of the rare earth aluminate phosphor having the composition represented by Formula (2A), the third nitride phosphor having the composition represented by Formula (2B), the alkaline earth metal aluminate phosphor having the composition represented by Formula (2C), the alkaline earth metal halosilicate phosphor having the composition represented by Formula (2D), the β-SiAlON phosphor having the composition represented by Formula (2E), the second sulfide phosphor having the composition represented by Formula (2F), the scandium-based phosphor having the composition represented by Formula (2G), the alkaline earth metal silicate-based phosphor having the composition represented by Formula (2H), and the alkaline earth metal silicate-based phosphor having the composition represented by Formula (2J). The second phosphor may include at least one type of phosphor alone or may include two or more types.

The light-emitting device preferably emits light having a color deviation Duv, which is a deviation from a black body radiation locus, preferably in a range from minus (−) 0.008 to plus (+) 0.008. The color deviation Duv is a deviation from the black body radiation locus of light emitted from the light-emitting device and is measured according to JIS Z8725. Even in the case of a relatively low correlated color temperature of 1950 K or less, when the color deviation Duv from the black body radiation locus (Duv: 0.000) on the CIE 1931 chromaticity diagram is within a range from −0.008 to +0.008, and light that allows irradiated objects to have a natural color and does not cause discomfort is emitted from the light-emitting device. The light-emitting device emits light having the color deviation Duv, which is a deviation from the black body radiation locus at 1950 K or less, preferably within a range from −0.008 to +0.008, more preferably within a range from −0.006 to +0.006, and even more preferably within a range from −0.003 to +0.003. When light is emitted having the color deviation Duv, which is a deviation from the black body radiation locus at 1950 K or less, of less than −0.008 or greater than +0.008, the color of irradiated objects deviates from the natural color, which may cause discomfort to humans.

Figure 1B:
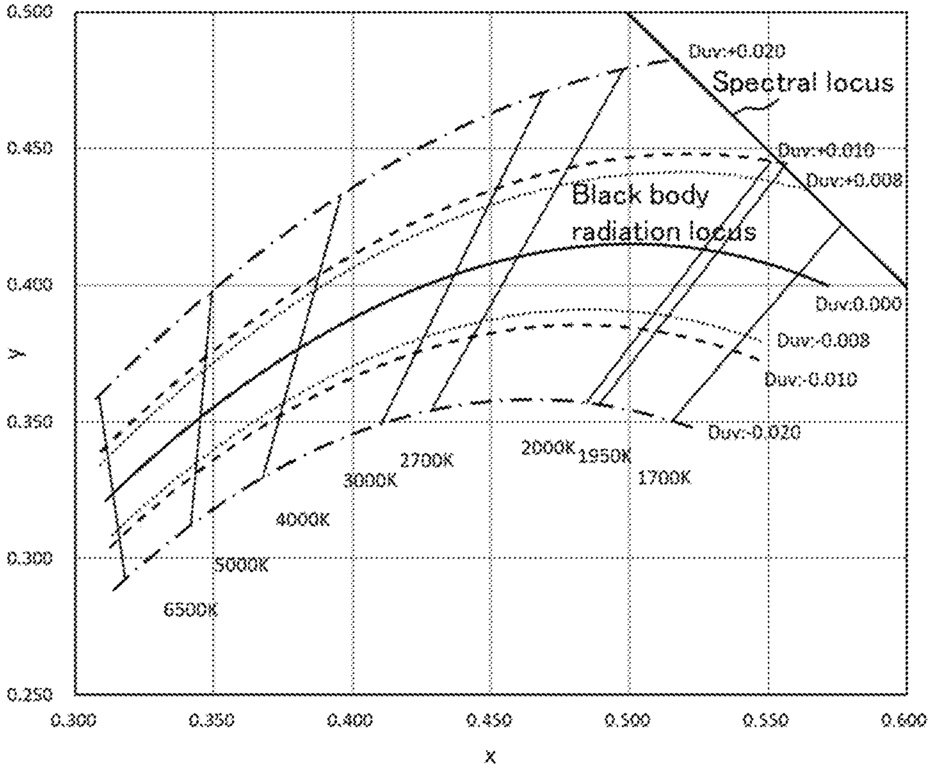
FIG. 1B is a partially enlarged view of FIG. 1A illustrating a black body radiation locus (Duv: 0.000) in the CIE 1931 chromaticity diagram in which the chromaticity coordinate x is in a range from 0.300 to 0.600 and the chromaticity coordinate y is in a range from 0.250 to 0.500, and each locus of color deviations (Duv: −0.020, −0.010, −0.008, +0.008, +0.010, and +0.020) from the black body radiation locus at each correlated color temperature.

FIG. 1A is a diagram illustrating a black body radiation locus (Duv: 0.000) within the spectral locus and pure purple locus on the CIE 1931 chromaticity diagram and color deviations from the black body radiation locus. FIG. 1B is a partially enlarged view of FIG. 1A illustrating a black body radiation locus on the CIE 1931 chromaticity diagram in which the chromaticity coordinate x is in a range from 0.300 to 0.600 and the chromaticity coordinate y is in a range from 0.250 to 0.500, and each locus of color deviations from the black body radiation locus with Duv of −0.020, Duv of −0.010, Duv of −0.008, Duv of +0.008, Duv of +0.010, and Duv of +0.020. As illustrated in FIG. 1B, the straight lines intersecting with the black body radiation locus (Duv: 0.000) are each an isotemperature line at each correlated color temperature (CCT of 1700 K, 1950 K, 2000 K, 2700 K, 3000 K, 4000 K, 5000 K, and 6500 K). In a case in which the color deviation Duv of the mixed color light emitted from the light-emitting device is 0.000, the locus thereof has no deviation from the black body radiation locus and is approximately the black body radiation locus.

The light-emitting device preferably emits light having a second radiance in a range from 650 nm to 750 nm being 50% or less with respect to 100% of a first radiance in a range from 400 nm to 750 nm. In the light emitted by the light-emitting device, the ratio of the second radiance in a range from 650 nm to 750 nm to 100% of the first radiance in a range from 400 nm to 750 nm is also referred to as Lp. When the ratio Lp of the second radiance to the first radiance in the light emitted by light-emitting device is 50% or less, among the mixed color light emitted from the light-emitting device, light with a relatively small amount of red component of light, without a reduction in luminance, and with the reduced insect-attracting effect is emitted from the light-emitting device. The ratio Lp of the second radiance to the first radiance of the light emitted by light-emitting device may be 45% or less, 40% or less, 35% or less, or 30% or less. The ratio Lp of the second radiance to the first radiance of the light emitted by light-emitting device may be 5% or greater or 8% or greater in order to emit light having good color rendering property.

The ratio Lp of the second radiance to the first radiance of the light emitted by light-emitting device is derived from the following Equation (4). The ratio Lp of the second radiance to the first radiance of the light emitted by light-emitting device indicates a ratio of the long wavelength red component of light in the mixed color light emitted from the light-emitting device.

[Math. 6]

$$Lp(\%) = \frac{\int_{650}^{750} S(\lambda)d\lambda}{\int_{400}^{750} S(\lambda)d\lambda} \times 100 \qquad (4)$$

The light-emitting device preferably emits light having a relative insect-attracting index $I/I_0$ of 99% or less. The relative insect-attracting index $I/I_0$ refers to a ratio of the insect-attracting index I derived from Equation (1) of the light-emitting device emitting light having a correlated color temperature of 1950 K or less when a reference insect-attracting index $I_0$ of the light-emitting device emitting light having a correlated color temperature of greater than 1950 K is 100%. Regarding the reference insect-attracting index $I_0$, an insect-attracting index having the lowest numerical value among the light-emitting devices to be measured that emit light having a correlated color temperature of greater than 1950 K can be used as the reference insect-attracting index $I_0$. When the relative insect-attracting index $I/I_0$ is as small as 99% or less, the effect of attracting insects is reduced, and light having the reduced insect-attracting effect is emitted from the light-emitting device. When light having a relative insect-attracting index $I/I_0$ of less than 10% is emitted from a light-emitting device, the reduced insect-attracting effect is greater than that of a light-emitting device that emits light having a correlated color temperature of greater than 1950 K, but the color balance of light is lost and the color rendering property is reduced. The light-emitting device preferably emits light having the relative insect-attracting index $I/I_0$ within a range from 10% to 99% in order to satisfy the color rendering property required for a light-emitting device used outdoors or a light-emitting device used indoors but at a location near the outdoors and increase the reduced insect-attracting effect. The light-emitting device that emits light having a correlated color temperature of 1950 K or less may have a relative insect-attracting index $I/I_0$ within a range from 10% to 99%, within a range from 30% to 97%, or within a range from 40% to 95%.

The insect-attracting index $I_0$ of a light-emitting device that emits light having a correlated color temperature of greater than 1950 K can be derived from the following Equation (5).

[Math. 7]

$$I_0 = \frac{\int_{250}^{615} S_0(\lambda) \times R(\lambda)d\lambda}{\int_{380}^{780} S_0(\lambda) \times V(\lambda)d\lambda} \qquad (5)$$

(where $I_0$ is an insect-attracting index of a light-emitting device having a correlated color temperature of greater than 1950 K, $S_0(\lambda)$ is a spectral radiance of light emitted by the light-emitting device having a correlated color temperature of greater than 1950 K, and $V(\lambda)$ and $R(\lambda)$ have the same meanings as in Equation (1).

The relative insect-attracting index $I/I_0$ (%) can be derived from the following Equation (6).

[Math. 8]

$$I/I_0(\%) = \frac{\int_{250}^{615} S(\lambda) \times R(\lambda)d\lambda / \int_{380}^{780} S(\lambda) \times V(\lambda)d\lambda}{\int_{250}^{615} S_0(\lambda) \times R(\lambda)d\lambda / \int_{380}^{780} S_0(\lambda) \times V(\lambda)d\lambda} \times 100 \qquad (6)$$

Figure 2:
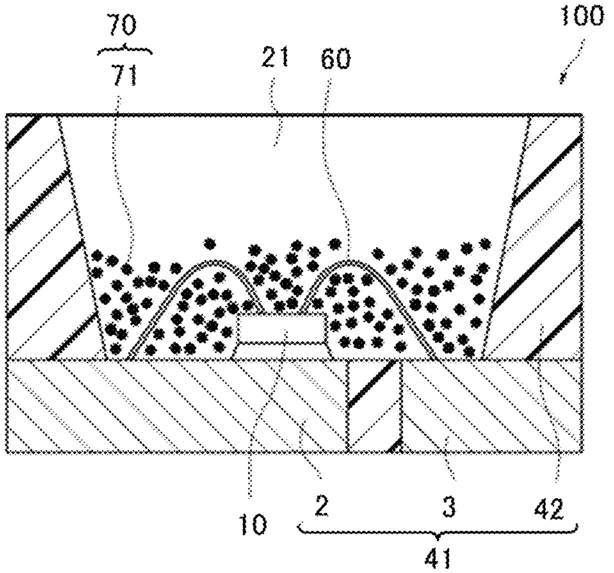
FIG. 2 is a schematic cross-sectional view illustrating an example of a light-emitting device of a first configuration example.
Figure 3:
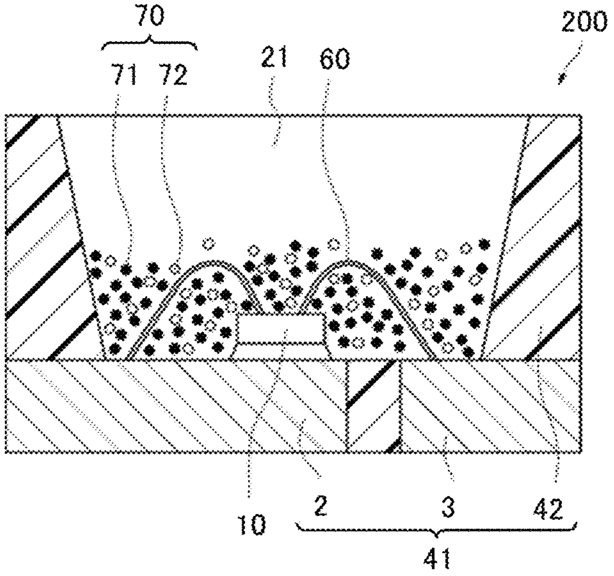
FIG. 3 is a schematic cross-sectional view illustrating an example of the light-emitting device of the first configuration example.

An example of the light-emitting device will be described on the basis of the drawings. FIGS. 2 and 3 are schematic cross-sectional views illustrating a light-emitting device of a first configuration example.

As illustrated in FIG. 2, a light-emitting device 100 includes a light-emitting element 10 having an emission peak wavelength in a range from 400 nm to 490 nm and a first phosphor 71 that emits light when excited by light from the light-emitting element 10.

The light-emitting device 100 includes a molded body 41, the light-emitting element 10, and a wavelength conversion member 21. The molded body 41 is formed by integrally molding a first lead 2, a second lead 3, and a resin portion 42 including a thermoplastic resin or a thermosetting resin. The molded body 41 forms a recessed portion including a bottom surface and lateral surfaces, and the light-emitting element 10 is mounted on the bottom surface of the recessed portion. The light-emitting element 10 includes a pair of positive and negative electrodes, and the pair of positive and negative electrodes are electrically connected to the first lead 2 and the second lead 3, respectively, via wires 60. The light-emitting element 10 is covered with the wavelength conversion member 21. The wavelength conversion member 21 includes, for example, phosphors 70 that convert the wavelength of the light from the light-emitting element 10 and a light transmissive material. The wavelength conversion member 21 also functions as a sealing member that covers the light-emitting element 10 and the phosphors 70 in the recessed portion of the molded body 40. The phosphors 70 include the first phosphor 71 having an emission peak wavelength within a range from 570 nm to 680 nm when excited by light from the light-emitting element. The first lead 2 and the second lead 3 connected to the pair of positive and negative electrodes of the light-emitting element 10 are partially exposed to the outside of a package forming the light-emitting device 100. The light-emitting device 100 can emit light by receiving power supplied from an external source via the first lead 2 and the second lead 3.

As illustrated in FIG. 3, a light-emitting device 200 is the same as the light-emitting device 100 illustrated in FIG. 2 except that the phosphors 70 further include a second phosphor 72 having an emission peak wavelength within a range from 480 nm to 570 nm, and like members are denoted by similar reference signs.

A wavelength conversion member in a light-emitting device of the first configuration example includes phosphors and a light transmissive material. Examples of the light transmissive material used in the wavelength conversion member include at least one selected from the group consisting of a resin, glass, and an inorganic material, and the light transmissive material is preferably a resin. The resin is preferably at least one selected from the group consisting of an epoxy resin, a silicone resin, a phenol resin, and a polyimide resin. The inorganic material may be at least one selected from the group consisting of aluminum oxide and aluminum nitride. The wavelength conversion member may include, in addition to the phosphors and the light transmissive material, a filler, a coloring agent, and a light diffusing material as necessary. Examples of the filler include silicon oxide, barium titanate, titanium oxide, and aluminum oxide. The content of the components other than the phosphors and the light transmissive material included in the wavelength conversion member can be within a range from 0.01 parts by mass to 50 parts by mass, and may be within a range from 0.1 parts by mass to 45 parts by mass, or within a range from 0.5 parts by mass to 40 parts by mass relative to 100 parts by mass of the light transmissive material, in terms of the total content of the other components.

Method for Manufacturing Light-Emitting Device of First Configuration Example

A method for manufacturing the light-emitting device of the first configuration example will now be described. For the details, the disclosure of JP 2010-062272 A may be referred to, for example. The method for manufacturing a light-emitting device preferably includes preparing a molded body, disposing a light-emitting element, disposing a composition for a wavelength conversion member, and forming a resin package. In a case in which a collective molded body including a plurality of recessed portions is used as the molded body, singulating may be included after forming the resin package to separate the resin package into respective unit regions.

In preparing the molded body, a plurality of leads are integrally molded using a thermosetting resin or a thermoplastic resin to prepare a molded body including a recessed portion including lateral surfaces and a bottom surface. The molded body may be formed from a collective base including a plurality of recessed portions.

In disposing the light-emitting element, the light-emitting element is disposed on the bottom surface of the recessed portion of the molded body, and the positive and negative electrodes of the light-emitting element are connected to the first lead and the second lead via wires.

In disposing the composition for a wavelength conversion member, the composition for a wavelength conversion member is disposed in the recessed portion of the molded body.

In forming the resin package, the composition for a wavelength conversion member disposed in the recessed portion of the molded body is cured to form a resin package, and thus a light-emitting device is manufactured. In a case in which a molded body formed from a collective base including a plurality of recessed portions is used, after forming the resin package, in the singulation, the collective base including a plurality of recessed portions is separated into the unit regions of the resin packages, and individual light-emitting devices are manufactured. In this manner, the light-emitting device of the first configuration example illustrated in FIG. 2 or 3 can be manufactured.

Figure 4:
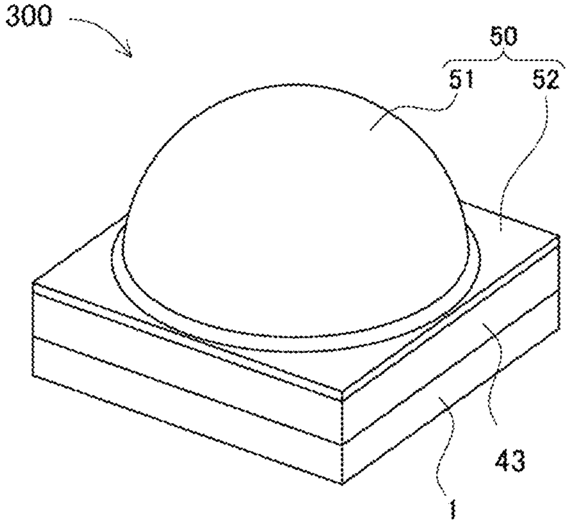
FIG. 4 is a schematic perspective view illustrating an example of a light-emitting device of a second configuration example.
Figure 5:
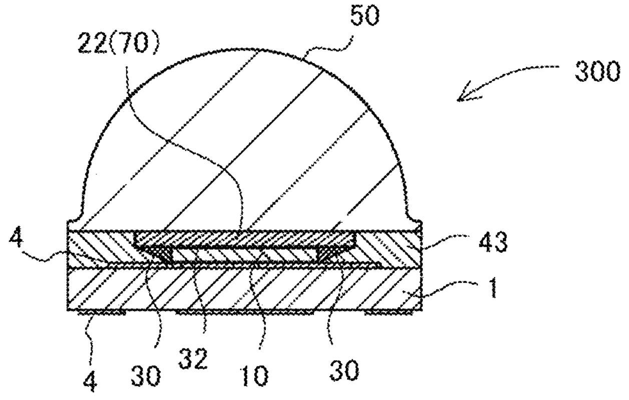
FIG. 5 is a schematic cross-sectional view illustrating an example of the light-emitting device of the second configuration example.

FIG. 4 is a schematic perspective view illustrating a light-emitting device of a second configuration example. FIG. 5 is a schematic cross-sectional view illustrating the light-emitting device of the second configuration example.

As illustrated in FIGS. 4 and 5, a light-emitting device 300 includes a support 1, the light-emitting element 10 disposed on the support 1, a wavelength conversion member 22 including the phosphors 70 disposed on the upper surface of the light-emitting element 10, and a light reflecting member 43 disposed on the support 1 at the side where the wavelength conversion member 22 and the light-emitting element 10 are. A sealing member 50 is provided on the upper surface of the wavelength conversion member 22. The sealing member 50 includes a lens portion 51 having a circular shape in a plan view and a semi-spherical shape in a cross-sectional view and a flange portion 52 extending to the outer peripheral side of the lens portion 51. The lens portion 51 has a circular shape in a plan view and a semi-spherical shape in a cross-sectional view. Also, the flange portion 52 extends to the outer peripheral side of the lens portion 51.

The wavelength conversion member 22 is formed larger than the light-emitting element 10 in a plan view. In addition, a light transmissive member 30 that comes into contact with the lateral surface of the light-emitting element 10 and a portion of the wavelength conversion member 22 is provided between the lateral surface of the light-emitting element 10 and a light reflecting member 43. The light transmissive member 30 includes a light transmissive bonding member 32 provided between the light-emitting element 10 and the wavelength conversion member 22. The light transmissive bonding member 32 may be an adhesive that bonds together the light-emitting element 10 and the wavelength conversion member 22. A portion of the light transmissive bonding member 32 may extend to a corner portion formed by the lateral surface of the light-emitting element 10 and the main surface of the wavelength conversion member 22 on the light-emitting element 10 side. As illustrated in FIG. 5, the cross-sectional shape of the extended light transmissive bonding member 32 can be an inverted triangle expanding in the direction of the light reflecting member 43. The light transmissive member 30 and the bonding member 32 can be made of a resin with light transmissivity. The support 1 is a member for mounting the light-emitting element 10, the sealing member 50, and the like on the upper surface of the support 1. The support 1 includes a base material with insulating properties and a conductive member 4 such as a wiring pattern for mounting a light-emitting element on the surface of the base material. The light reflecting member 43 is a member for covering the light transmissive member 30, the bonding member 32, and the wavelength conversion member 22. For the details of the light-emitting device of the second configuration example and the method for manufacturing the light-emitting device of the second configuration example described below, the disclosure of JP 2020-57756 A can be referred to, for example.

As with the wavelength conversion member of the light-emitting device of the first configuration example, the wavelength conversion member of the light-emitting device of the second configuration example includes phosphors and a light transmissive material. The phosphors include a first phosphor having an emission peak wavelength within a range from 570 nm to 680 nm when excited by light from the light-emitting element. The phosphors may include a second phosphor having an emission peak wavelength within a range from 480 nm to 570 nm when excited by light from the light-emitting element. As the light transmissive material, the same light transmissive material as that used in the wavelength conversion member of the light-emitting device of the first configuration example can be used. In addition to the phosphors and the light transmissive material, the wavelength conversion member of the light-emitting device of the second configuration example may include a filler, a coloring agent, and a light diffusing material as necessary as with the wavelength conversion member of the light-emitting device of the first configuration example.

Method for Manufacturing Light-Emitting Device of Second Configuration Example

An example of a method for manufacturing the light-emitting device of the second configuration example will now be described. The method for manufacturing the light-emitting device of the second configuration example includes disposing the light-emitting element, preparing the wavelength conversion member, forming the light transmissive member and the bonding member, disposing the light reflecting member, and disposing the sealing member, and may further include singulating by separating into unit regions.

In disposing the light-emitting element, the light-emitting element is flip-chip mounted on a support prepared in advance. In preparing the wavelength conversion member, a composition for a wavelength conversion member including phosphors and the light transmissive material is cured to form a plate-like, sheet-like, or layer-like shape in advance and then singulated at a size that allows it to be disposed on the light-emitting element to prepare a plate-like, sheet-like, or layer-like wavelength conversion member. In forming the light transmissive member and the bonding member, an adhesive with light transmissivity is applied onto the upper surface of the light-emitting element, and the wavelength conversion member is bonded to the upper surface of the light-emitting element. The adhesive protruding from the interface between the light-emitting element and the wavelength conversion member extends and adheres from the lateral surface of the light-emitting element to the periphery of the wavelength conversion member, forms a fillet shape, and is cured to form the light transmissive member and the bonding member. In disposing the light reflecting member, a white resin is disposed and cured on the upper surface of the support so as to cover the lateral surfaces of the wavelength conversion member and the light transmissive member, thus disposing the light reflecting member. Finally, the sealing member is disposed on the upper surfaces of the wavelength conversion member and the light reflecting member. In this manner, the light-emitting device of the second configuration example can be manufactured.

Light Fixture

It is sufficient that the light fixture includes at least one of the light-emitting devices described above. The light fixture includes the above-described light-emitting device and may further include a reflecting member, a protective member, an accessory device for supplying power to the light-emitting device, and the like. The light fixture may also include a plurality of light-emitting devices. In a case in which the light fixture includes a plurality of light-emitting devices, the light fixture may include a plurality of the same light-emitting devices or a plurality of light-emitting devices having different forms. In addition, a drive device that can individually drive the plurality of light-emitting devices and adjust the brightness or the like of each light-emitting device may be provided. The form of use of the light fixture may be any of a direct attaching-type, an embedding-type, a pendant-type, or the like.

Street Light

Figure 6:
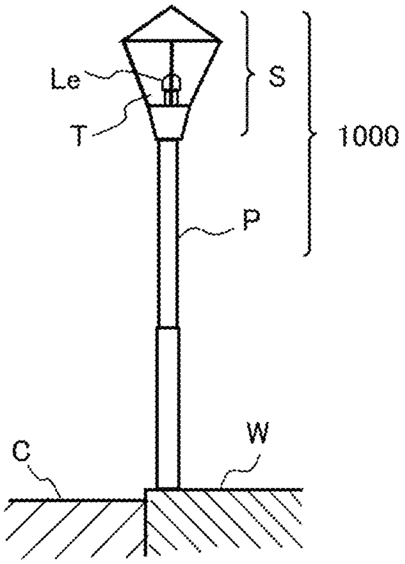
FIG. 6 is a schematic diagram illustrating an example of a street light.

It is sufficient that the street light includes at least one of the light-emitting devices described above. FIG. 6 is a schematic diagram illustrating an example of a street light. A street light 1000 includes a pole P installed on a sidewalk W or a roadway C and a support portion S of a light-emitting device Le, and the support portion S includes a light transmitting portion T which covers the periphery of the light-emitting device Le and transmits at least part of the light emitted by the light-emitting device Le, the light transmitting portion being made of acrylic, polycarbonate, glass, or the like. The street light 1000 can illuminate a low place from a high place via the light-emitting device Le installed on the support portion S integrated with the pole P. The street light is not limited to the example illustrated in FIG. 6.

The street light may be a pole-type street light provided with a pole that allows the height of the support portion to be set discretionarily, may be a bracket-type street light in which the support portion is supported with a bracket instead of a pole, may be a floodlight-type street light that illuminates upward from below, and may be a landscape material-embedded-type street light that is incorporated into a landscape material such as a pillar or a block.

EXAMPLES

The present invention will be described in detail hereinafter using examples. However, the present invention is not limited to these examples.

In the light-emitting devices of the examples and the comparative examples, the following first phosphor and/or second phosphor was used.

First Phosphor

As the first phosphor, first nitride phosphors BSESN-1, BSESN-2, and BSESN-3 included in the composition represented by Formula (1A) and second nitride phosphors SCASN-1, SCASN-2, SCASN-3, SCASN-4, SCASN-5, and SCASN-6 included in the composition represented by Formula (1B), each of which has a different emission peak wavelength and full width at half maximum as listed in Table 1, were prepared.

Second Phosphor

As the second phosphor, rare earth aluminate phosphors G-YAG1 and G-YAG2 including Y, Al, and Ga included in the composition represented by Formula (2A) and rare earth aluminate phosphors YAG1 and YAG3 including Y and Al included in the composition represented by Formula (2A), each of which has a different emission peak wavelength and full width at half maximum as listed in Table 2, were prepared.

Measurement of Emission Spectrum of Phosphor

Using a quantum efficiency measurement device (QE-2000 available from Otsuka Electronics Co., Ltd.), each phosphor was irradiated with light having an excitation wavelength of 450 nm, the emission spectrum of each phosphor at room temperature (approximately 25° C.) was measured, and the emission peak wavelength and the full width at half maximum were measured from the emission spectrum. The results are listed in Tables 1 and 2.

TABLE 1

| | Peak wave length (nm) | Fullwidth at half maximum (nm) |
|---|---|---|
| SCASN1 | 608 | 73.5 |
| SCASN2 | 612 | 74.6 |
| SCASN3 | 620 | 72.9 |
| SCASN4 | 628 | 75.4 |
| SCASN5 | 639 | 83.7 |
| SCASN6 | 642 | 96.4 |
| BSESN1 | 582 | 69.2 |
| BSESN2 | 586 | 74.2 |
| BSESN3 | 594 | 80.6 |

TABLE 2

| | Peak wave length (nm) | Fullwidth at half maximum (nm) |
|---|---|---|
| G-YAG1 | 539 | 108.8 |
| G-YAG2 | 540 | 109 |
| YAG1 | 548 | 111.2 |
| YAG3 | 565 | 118.9 |

Example 1

The light-emitting device of the second configuration example was manufactured. FIGS. 4 and 5 can be referred to for the light-emitting device of the second configuration example.

Disposing of Light-Emitting Element

A ceramic substrate including aluminum nitride as a material was used as the support 1. The light-emitting element 10 used included nitride-based semiconductor layers with an emission peak wavelength of 450 nm. The size of the light-emitting element 10 corresponded to a roughly square planar shape of approximately 1.0 mm squared and a thickness of approximately 0.11 mm. The light-emitting element was disposed with the light emission surface on the sealing member side and flip-chip mounted via a bump using the conductive member 4 made of Au.

Preparing of Wavelength Conversion Member

A silicone resin was used as the light transmissive material forming the wavelength conversion member 22. In the composition for a wavelength conversion member, in order to obtain a correlated color temperature at or near 1850 for a mixed color light of light emitted from the light-emitting element 10 and light emitted from the phosphors 70 including the first phosphor and the second phosphor, the first phosphor and the second phosphor were blended to obtain the total amount of the phosphors 70, relative to 100 parts by mass of the light transmissive material, and the blending ratio of the first phosphor and the second phosphor as listed in Table 3. In the composition for a wavelength conversion member, 2 parts by mass of the aluminum oxide was blended as a filler relative to 100 parts by mass of the silicone resin. Subsequently, the prepared composition for a wavelength conversion member was heated at 180° C. for 2 hours and cured into a sheet-like shape. Then, the singulated sheet-like wavelength conversion member 22 was prepared having a roughly square planar shape of approximately 1.6 mm squared and a thickness of approximately 150 μm, which is approximately 0.1 mm larger in length and width than the planar shape of the light-emitting element 10.

Forming of Light Transmissive Member and Bonding Member

A phenyl silicone resin, which was an adhesive with light transmissivity, was applied onto the upper surface of the light-emitting element 10 to bond the wavelength conversion member 22 thereon, the adhesive with light transmissivity was further applied to the interface between the light-emitting element 10 and the wavelength conversion member 22, and then cured at 150° C. for 4 hours to form the light transmissive member 30 and the bonding member 32, which were cured in a fillet shape extending from the lateral surface of the light-emitting element 10 to the periphery of the wavelength conversion member 22.

Disposing of Light Reflecting Member

A composition for a light reflecting member including a dimethyl silicone resin and titanium oxide particles having an average particle size (catalog value) of 0.28 μm in which the amount of the titanium oxide particles is 60 parts by mass relative to 100 parts by mass of the dimethyl silicone resin was prepared. The composition for a light reflecting member, which is a white resin, was disposed on the upper surface of the support 1 to cover the lateral surfaces of the wavelength conversion member 22 and the light transmissive member 30 and then cured to form the light reflecting member 43.

Disposing of Sealing Member

Finally, the sealing member 50 including the lens portion 51 formed by curing phenyl silicone resin and having a circular shape in a plan view and a semi-spherical shape in a cross-sectional view and the flange portion 52 extending to the outer peripheral side of the lens portion 51 was disposed to manufacture the light-emitting device 300 of the second configuration example that emits light having a correlated color temperature of 1950 K or less.

Comparative Example 1

The light-emitting device 300 of the second configuration example that emits light having a correlated color temperature of 2200 K or greater was manufactured in the same manner as in Example 1, except that in preparing the wavelength conversion member, in order to obtain a correlated color temperature at or near 2200 for a mixed color light of light emitted from the light-emitting element 10 and light emitted from the phosphors 70 including the first phosphor and the second phosphor, the composition for a wavelength conversion member including the first phosphor and the second phosphor was prepared to obtain the total amount of the phosphors 70, relative to 100 parts by mass of the light transmissive material, and the blending ratio of the first phosphor and the second phosphor listed in Table 3.

Examples 2 to 5

The light-emitting device of the first configuration example was manufactured. The light-emitting device of the first configuration example includes the first phosphor and the second phosphor as illustrated in FIG. 3.

The light-emitting element 10 used included nitride-based semiconductor layers with an emission peak wavelength of 450 nm. The size of the light-emitting element 10 corresponded to a roughly square planar shape of approximately 700 mm squared and a thickness of approximately 200 mm.

A lead frame was used as the first lead 2 and the second lead 3, and the first lead 2 and the second lead 3 were integrally molded using an epoxy resin to prepare the molded body 41 including the recessed portion with the lateral surfaces and the bottom surface.

The light-emitting element 10 was disposed on the bottom surface of the recessed portion of the molded body 41, and the positive and negative electrodes of the light-emitting element 10 were connected to the first lead 2 and the second lead 3 via the wires 60 made of Au. A silicone resin was used as the light transmissive material forming the wavelength conversion member 21. In the composition for a wavelength conversion member, in order to obtain a correlated color temperature at or near 1850 K for a mixed color light of light emitted from the light-emitting element 10 and light emitted from the phosphors 70 including the first phosphor 71 and the second phosphor 72, the first phosphor 71 and the second phosphor 72 were blended to obtain the total amount of the phosphors 70, relative to 100 parts by mass of the light transmissive material, and the blending ratio of the first phosphor 71 and the second phosphor 72 listed in Table 3. In the composition for a wavelength conversion member, 2 parts by mass of the aluminum oxide was also blended as a filler relative to 100 parts by mass of the silicone resin. Subsequently, the prepared composition for a wavelength conversion member was inserted into the recessed portion of the molded body 41.

The composition for a wavelength conversion member inserted into the recessed portion of the molded body 41 was heated at 150° C. for 3 hours and cured to form a resin package including the wavelength conversion member 21 including the first phosphor 71 and the second phosphor 72. Thus, the light-emitting device 200 of the first configuration example that emits light having a correlated color temperature of 1950 K or less was manufactured.

Example 6

The light-emitting device of the first configuration example was manufactured. The light-emitting device of the first configuration example includes only the first phosphor but not the second phosphor as illustrated in FIG. 2.

The resin package was formed and the light-emitting device 100 of the first configuration example that emits light having a correlated color temperature of 1950 K or less was manufactured in the same manner as in Example 2, except that the first phosphor 71 is made 100 mass % relative to the total amount (total amount of the first phosphor 71) of the phosphors 70 and the total amount of the first phosphor 71 and the second phosphor using the first phosphor 71 listed for each example in Table 3 as the composition for a wavelength conversion member. As listed in Table 3, as the first phosphor, two different types of the first nitride phosphor, BSESN2 and BSESN3, having the composition represented by Formula (1A) were used, and the mass ratio (BSESN2/BSESN3) of BSESN2 and BSESN3 was 40/60.

Example 7

The light-emitting device 100 of the first configuration sample that emits light having a correlated color temperature of 1950 K or less was manufactured in the same manner as in Example 6, except that two types, the first nitride phosphor (BSESN1) having the composition represented by Formula (1A) and the second nitride phosphor (SCASN5) having the composition represented by Formula (1B) are used as the first phosphor and the mass ratio (BSESN1/SCASN5) of BSESN1 and SCASN5 was 93.3/6.7 as listed in Table 3.

Comparative Examples 2 and 3

The light-emitting device of the first configuration example was manufactured. The light-emitting device of the first configuration example included the first phosphor and the second phosphor as illustrated in FIG. 3.

As the composition for a wavelength conversion member, a composition for a wavelength conversion member including the first phosphor 71 and the second phosphor 72 was prepared to obtain the total amount of the phosphors 70 and the blending ratio of the first phosphor 71 and the second phosphor 72 listed in Table 3, relative to 100 parts by mass of the phenyl silicone resin as the light transmissive material, so as to obtain a correlated color temperature at or near 2000 for a mixed color light of light emitted from the light-emitting element 10 and light emitted from the phosphors 70 including the first phosphor 71 and the second phosphor 72.

The composition for a wavelength conversion member was placed onto the light-emitting element 10 in the recessed portion of the molded body 41, injected into the recessed portion, and heated at 150° C. for 4 hours to cure the composition for the wavelength conversion member and form the wavelength conversion member 21. Thus, the light-emitting device 200 of the first configuration example that emits light having a correlated color temperature in a range from greater than 1950 K to 2000 K was manufactured.

The following measurements were performed for the light-emitting devices. The results are listed in Table 3.

Emission Spectrum of Light-Emitting Device

For each light-emitting device, the emission spectrum was measured using an optical measurement system combining a spectrophotometer (PMA-12, Hamamatsu Photonics K.K.) and an integrating sphere. The emission spectrum of each light-emitting device was measured at room temperature (in a range from 20° ° C. to 30° C.). FIGS. 7 to 11 illustrate the emission spectrum (spectral radiance) S(λ) of each light-emitting device when the luminance L derived from Equation (2) of each light-emitting device is set to the same value, the spectral luminous efficiency function V(λ) for human photopic vision (human visual sensitivity), and the insect spectral luminous efficiency (Bickford) R(λ) (insect visual sensitivity).

Chromaticity Coordinates (x, y), Correlated Color Temperature (K), Color Deviation Duv, Average Color Rendering Index Ra, Special Color Rendering Index R9, and Full Width at Half Maximum From the emission spectrum of each light-emitting device, the chromaticity coordinates (x value, y value) on the CIE chromaticity diagram of CIE 1931, the correlated color temperature (CCT:K) and color deviation Duv according to JIS Z8725, the average color rendering index Ra according to JIS Z8726, the special color rendering index R9, and the full width at half maximum were measured.

Ratio Lp of Second Radiance to First Radiance

From the emission spectrum (spectral radiance) S(λ) of each light-emitting device, the ratio Lp (%) of the second radiance in a range from 650 nm to 750 nm was calculated on the basis of Equation (4) when the first radiance in a range from 400 nm to 750 nm was 100%.

Insect-Attracting Index I

The emission spectrum (spectral radiance) S(λ) measured for each light-emitting device, the spectral luminous efficiency function V(λ) for human photopic vision specified by the CIE, and the insect spectral luminous efficiency (Bickford) R(λ) were substituted into Equation (1) and the insect-attracting index I of each light-emitting device was measured. For the spectral luminous efficiency function V(λ) for human photopic vision, an emission spectrum with the maximum light emission intensity (emission peak wavelength) set to 1 was used. For the insect spectral luminous efficiency R(λ), an emission spectrum with the maximum light emission intensity (emission peak wavelength) set to 1 was used.

Relative Insect-Attracting Index $I/I_0$

The insect-attracting index of the light-emitting device of Comparative Example 3, which had the lowest numerical value for the insect-attracting index I among the light-emitting devices of Comparative Examples 1 to 3 that emit light having a correlated color temperature of greater than 1950 K, was defined as the reference insect-attracting index $I_0$. The relative insect-attracting index $I/I_0$, which is the ratio of the insect-attracting index I of each light-emitting device to the reference insect-attracting index $I_0$, was calculated on the basis of Equation (6).

light-emitting device could suppress light components on the long wavelength side that are difficult for humans to perceive. Also, the light-emitting devices according to Examples 1 to 7 each emitted light having an insect-

TABLE 3

| | Phosphor: First phosphor | Phosphor: Second phosphor | Phosphor total amount (parts by mass) | Blending ratio (mass %): First phosphor | Blending ratio (mass %): Second phosphor | Chromaticity coordinates x | Chromaticity coordinates y | Correlated color temperature CCT (K) |
|---|---|---|---|---|---|---|---|---|
| Example1 | SCASN3 | YAG1 | 209.0 | 24.0 | 76.0 | 0.540 | 0.411 | 1874 |
| Example2 | SCASN4 | G-YAG2 | 142.1 | 11.3 | 88.7 | 0.544 | 0.409 | 1840 |
| Example3 | SCASN3 | G-YAG2 | 131.6 | 16.9 | 83.1 | 0.543 | 0.410 | 1841 |
| Example4 | SCASN1 | G-YAG2 | 125.9 | 52.7 | 47.4 | 0.543 | 0.410 | 1845 |
| Example5 | SCASN1 | YAG3 | 102.4 | 51.2 | 48.8 | 0.544 | 0.408 | 1837 |
| Example6 | BSESN2/ BSESN3 = 40/60 | — | 75.0 | 100 | — | 0.544 | 0.408 | 1837 |
| Example7 | BSESN1/ SCASN5 = 93.3/6.7 | — | 89.2 | 100 | — | 0.543 | 0.410 | 1844 |
| Comparative Example1 | SCASN3 | YAG1 | 170.0 | 17.0 | 83.0 | 0.503 | 0.418 | 2231 |
| Comparative Example2 | SCASN6 | G-YAG1 | 120.0 | 16.3 | 83.7 | 0.528 | 0.413 | 1983 |
| Comparative Example3 | SCASN2 | G-YAG1 | 108.0 | 27.4 | 72.6 | 0.527 | 0.413 | 1995 |

| | Color deviation Duv | Average color rendering index Ra | Special color rendering index R9 | Fullwidth at half maximum (nm) of emission peak having maximum light emission intensity | Ratio LP of radiance (%) 650-750/ 400-750 | Insect-attracting index I | Relative insect-attracting index $I/I_0$ (%) |
|---|---|---|---|---|---|---|---|
| Example1 | 0.000 | 65 | −48 | 83 | 17 | 0.025 | 79.4 |
| Example2 | 0.000 | 77 | −13 | 85 | 21 | 0.030 | 94.3 |
| Example3 | 0.000 | 69 | −39 | 81 | 18 | 0.028 | 88.1 |
| Example4 | 0.000 | 53 | −84 | 75 | 14 | 0.023 | 71.8 |
| Example5 | 0.000 | 52 | −79 | 81 | 17 | 0.020 | 62.4 |
| Example6 | 0.000 | 30 | −134 | 73 | 15 | 0.014 | 42.8 |
| Example7 | 0.000 | 40 | −100 | 86 | 18 | 0.015 | 47.8 |
| Comparative Example1 | −0.002 | 70 | −36 | 95 | 17 | 0.039 | 122.4 |
| Comparative Example2 | 0.000 | 84 | 27 | 118 | 31 | 0.034 | 105.5 |
| Comparative Example3 | 0.000 | 61 | −65 | 80 | 15 | 0.032 | 100.0 |

As listed in Table 3, the light-emitting devices according to Examples 1 to 7 each had a correlated color temperature of 1950 K or less and, for example, emitted light having a correlated color temperature that is substantially equal to or slightly lower than that of light emitted by a high-pressure sodium lamp. Even in a case in which the light-emitting devices according to Examples 1 to 7 are used as a light source of a light fixture used outdoors instead of a high-pressure sodium lamp, the color of irradiated objects is natural and the emitted light does not cause discomfort. In addition, in the light-emitting devices according to Examples 1 to 7, the full width at half maximum of the emission peak having the maximum light emission intensity in the emission spectrum was within a range from 3 nm to 110 nm. The emission peak wavelength in the emission spectrum of the light-emitting device was within a range from 570 nm to 680 nm. Since the full width at half maximum of the emission peak having the maximum light emission intensity in the emission spectrum of the light-emitting device was in a range from 3 nm to 110 nm, the attracting index I derived from Equation (1) of 0.031 or less and, with respect to the luminance of the light emitted by light-emitting device, had a reduced effect of attracting insects and thus the reduced insect-attracting effect.

For the light-emitting devices according to Examples 1 to 7, even in a case of emitting light having a color deviation Duv, which is a deviation from the black body radiation locus, of 0.000 and light having a correlated color temperature of 1950 K or less, regarding the light emitted from the light-emitting devices, the color of irradiated objects is natural and the emitted light does not cause discomfort.

The light-emitting devices according to Examples 1 to 7 each emitted light with the ratio Lp of the second radiance in a range from 650 nm to 750 nm being 30% or less with respect to 100% of the first radiance in a range from 400 nm to 750 nm. In the light-emitting devices according to Examples 1 to 7, in the mixed color light emitted from each light-emitting device, there was a relatively small amount of red component light and the light emitted had the reduced insect-attracting effect without causing discomfort in humans.

The light-emitting devices according to Examples 1 to 7 each had a relative insect-attracting index $I/I_0$ in a range from 30% to 95% and had a reduced effect of attracting insects and thus the reduced insect-attracting effect.

The light-emitting devices according to Examples 1 to 5 each had an average color rendering index Ra of 51 or greater, and emitted light had sufficient color rendering property even when illuminating, for example, a road with a large amount of traffic or people.

The light-emitting devices according to Examples 6 and 7 each emitted light having an average color rendering index Ra of 30 or greater, sufficient color rendering property for illuminating a road or the like, a low insect-attracting index I of 0.020 or less, a relative insect-attracting index $I/I_0$ in a range from 40% to 50%, and a large reduced insect-attracting effect.

The light-emitting devices according to Comparative Examples 1 to 3 each emitted light having a correlated color temperature slightly higher than that of light emitted by a high-pressure sodium lamp. For example, when the light-emitting devices are used instead of a high-pressure sodium lamp as a light source of a light fixture used outdoors, such as a street light or a road illumination light, the color of irradiated objects does not look natural and may cause discomfort. In addition, in the light-emitting devices according to Comparative Examples 1 to 3, the insect-attracting index I was greater than 0.031, the relative insect-attracting index $I/I_0$ was also 100% or greater, and the effect of attracting insects was not reduced.

Figure 7:
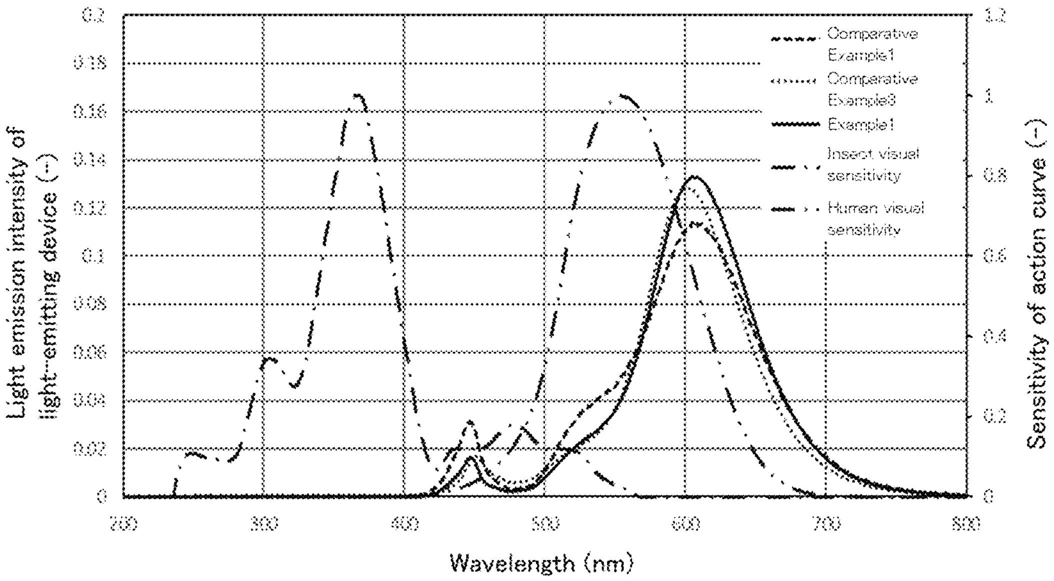
FIG. 7 is a graph illustrating the spectral radiance of a light-emitting device according to Example 1 and light-emitting devices according to Comparative Examples 1 and 3, the visual sensitivity (spectral luminous efficiency) of insects, and the visual sensitivity (spectral luminous efficiency function for photopic vision) of humans.

As illustrated in FIG. 7, the spectral radiance of the light-emitting device according to Example 1 was lower than the spectral radiance of the light-emitting devices according to Comparative Examples 1 and 3 in a wavelength range from 400 nm to 615 nm and particularly in a wavelength range from 400 nm to 550 nm, which overlap with the spectral luminous efficiency of insects. Thus, the light-emitting device had a reduced effect of attracting insects and thus the reduced insect-attracting effect.

Figure 8:
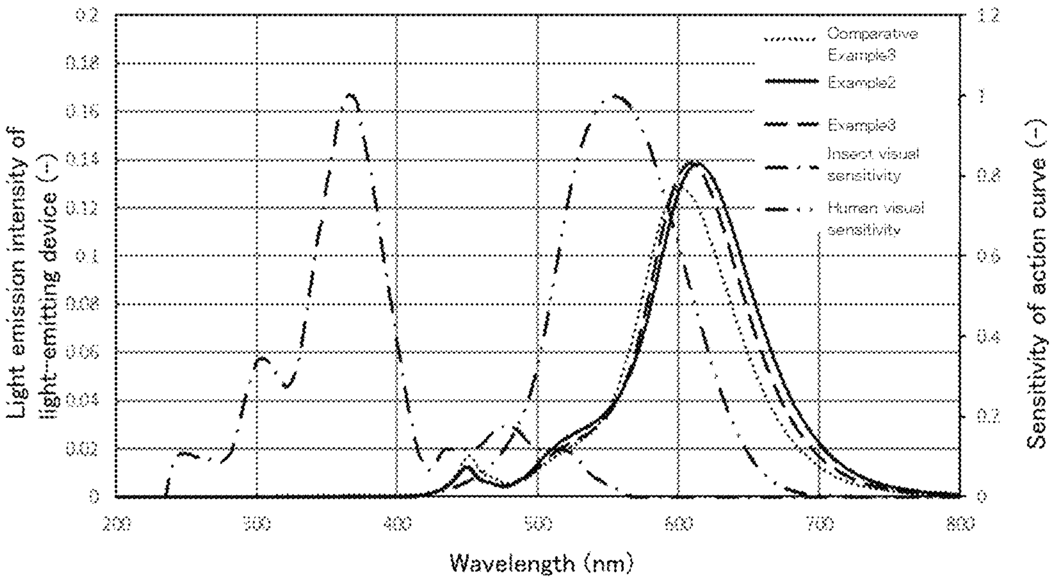
FIG. 8 is a graph illustrating the spectral radiance of light-emitting devices according to Examples 2 and 3 and a light-emitting device according to Comparative Example 3, the visual sensitivity (spectral luminous efficiency) of insects, and the visual sensitivity (spectral luminous efficiency function for photopic vision) of humans.

As illustrated in FIG. 8, the spectral radiance of the light-emitting devices according to Examples 2 and 3 was slightly lower than the spectral radiance of the light-emitting device according to Comparative Example 3 in a wavelength range from 400 nm to 615 nm which overlaps with the spectral luminous efficiency of insects. Thus, the light-emitting devices had a reduced effect of attracting insects and thus the reduced insect-attracting effect. Also, the spectral radiance of the light-emitting devices according to Examples 2 and 3 was slightly higher than the spectral radiance of the light-emitting device according to Comparative Example 3 in a wavelength range from 600 nm to 750 nm. Thus, the light emitted had excellent color rendering property with an average color rendering index Ra of 60 or greater.

Figure 9:
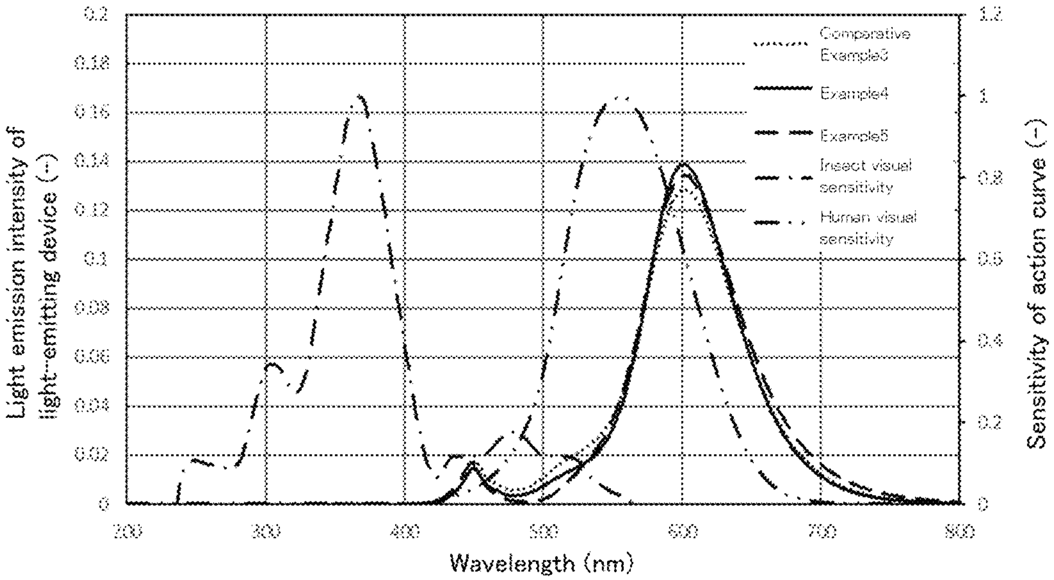
FIG. 9 is a graph illustrating the spectral radiance of light-emitting devices according to Examples 4 and 5 and a light-emitting device according to Comparative Example 3, the visual sensitivity (spectral luminous efficiency) of insects, and the visual sensitivity (spectral luminous efficiency function for photopic vision) of humans.

As illustrated in FIG. 9, the spectral radiance of the light-emitting devices according to Examples 4 and 5 was lower than the spectral radiance of the light-emitting device according to Comparative Example 3 in a wavelength range from 400 nm to 615 nm and particularly in a wavelength range from 400 nm to 550 nm, which overlap with the spectral luminous efficiency of insects. Thus, the light-emitting devices had a reduced effect of attracting insects and thus the reduced insect-attracting effect.

Figure 10:
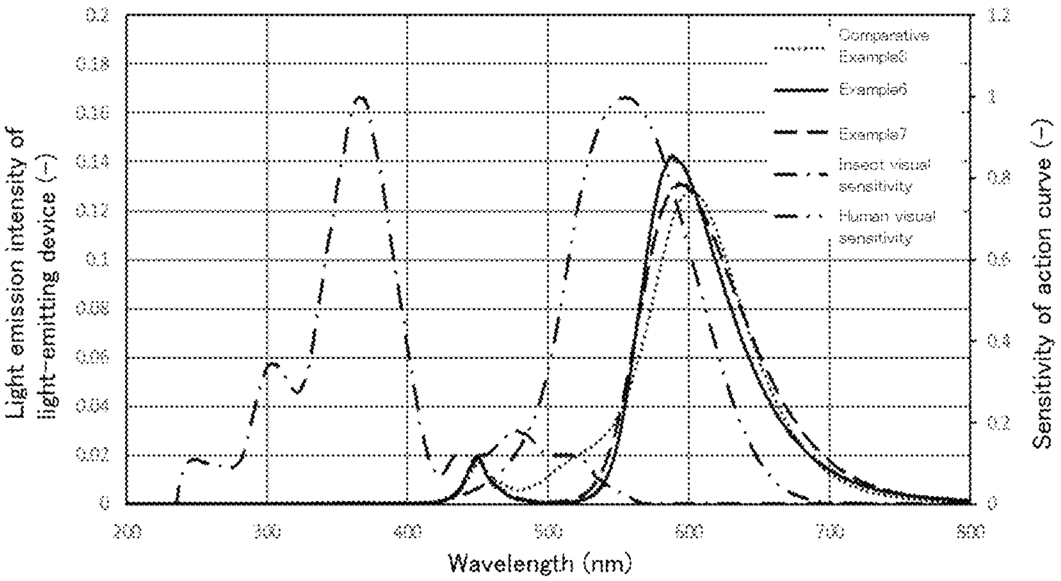
FIG. 10 is a graph illustrating the spectral radiance of light-emitting devices according to Examples 6 and 7 and a light-emitting device according to Comparative Example 3, the visual sensitivity (spectral luminous efficiency) of insects, and the visual sensitivity (spectral luminous efficiency function for photopic vision) of humans.

As illustrated in FIG. 10, the spectral radiance of the light-emitting devices according to Examples 6 and 7 was significantly lower than the spectral radiance of the light-emitting device according to Comparative Example 3 in a wavelength range from 400 nm to 615 nm and particularly in a wavelength range from 400 nm to 550 nm, which overlap with the spectral luminous efficiency of insects. Thus, the light-emitting devices had a greatly reduced effect of attracting insects, and thus the reduced insect-attracting effect was great.

Figure 11:
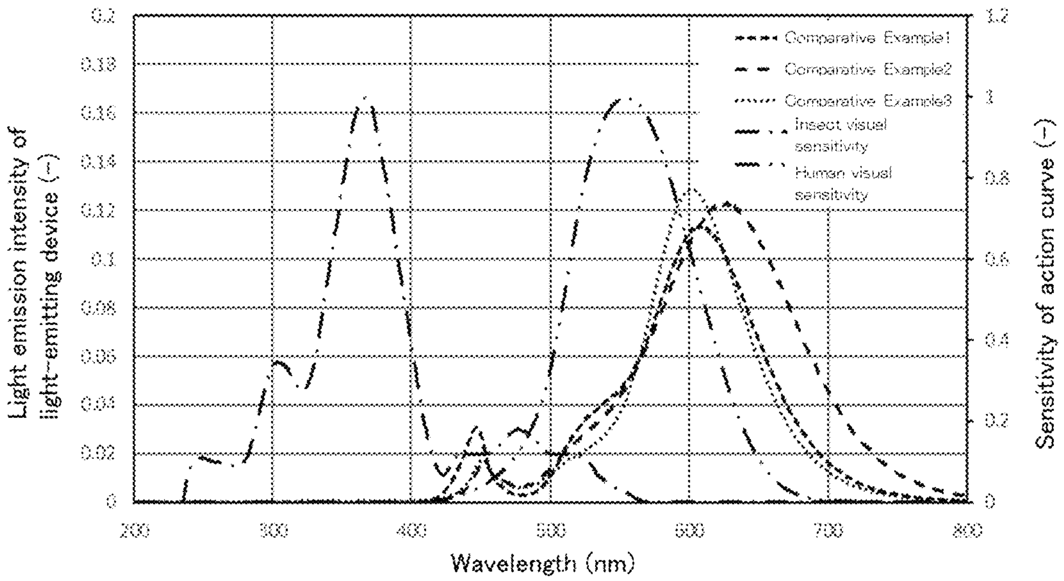
FIG. 11 is a graph illustrating the spectral radiance of light-emitting devices according to Comparative Examples 1, 2, and 3, the visual sensitivity (spectral luminous efficiency) of insects, and the visual sensitivity (spectral luminous efficiency function for photopic vision) of humans.

As illustrated in FIG. 11, the spectral radiance of the light-emitting devices according to Comparative Examples 2 and 3 was substantially equal to the spectral radiance of the light-emitting device according to Comparative Example 3 in a wavelength range from 400 nm to 615 nm which overlaps with the spectral luminous efficiency of insects. Thus, the effect of attracting insects was not reduced. Also, the spectral radiance of the light-emitting device according to Comparative Example 2 had a larger amount of red component than Comparative Example 3 in a wavelength range from 600 nm to 750 nm. Thus, the color balance of the mixed color light was off.

INDUSTRIAL APPLICABILITY

The light-emitting device according to an aspect of the present invention can be used as a light source for street lights, light fixtures installed outdoors such as at harbors and tunnels, light fixtures that are expected to be used outdoors such as headlights, flashlights, and portable lanterns using LEDs, and light fixtures used indoors but at locations near the outdoors such as near entrances, exits, and windows, which are required for reduced insect-attracting effect.

REFERENCE SIGNS LIST

1 Support
2 First lead
3 Second lead
4 Conductive member
10 Light-emitting element
21, 22 Wavelength conversion member
30 Light transmissive member
32 Light transmissive bonding member
41 Molded body
42 Resin portion
43 Light reflecting member
50 Sealing member
51 Lens portion
52 Flange portion
60 Wire
70 Phosphor
71 First phosphor
72 Second phosphor
100, 200, 300 Light-emitting device
1000 Street light
C Roadway
Le Light source
P Pole
S Support portion
T Light transmitting portion
W Sidewalk

The invention claimed is:

1. A light-emitting device comprising:

a light-emitting element having an emission peak wavelength within a range from 400 nm to 490 nm; and a first phosphor having an emission peak wavelength within a range from 570 nm to 680 nm, wherein the light-emitting device has a correlated color temperature of 1950 K or less, an average color rendering index Ra of 51 or greater, and a full width at half maximum of an emission peak having a maximum light emission intensity in an emission spectrum of the light-emitting device of 110 nm or less, and the light-emitting device emits light having an insect-attracting index I derived from Equation (1) of 0.031 or less, the insect-attracting index I being a ratio of an effective radiance of the light-emitting device in consideration of spectral luminous efficiency of insects in a range from 250 nm to 615 nm to a luminance of light emitted by the light-emitting device in a range from 380 nm to 780 nm in consideration of spectral luminous efficiency for human photopic vision specified by the CIE (International Commission on Illumination), $$I = \frac{\int_{250}^{615} S(\lambda) \times R(\lambda) d\lambda}{\int_{380}^{780} S(\lambda) \times V(\lambda) d\lambda} \quad (1)$$

where $S(\lambda)$ is a spectral radiance of light emitted by a light-emitting device, $V(\lambda)$ is a spectral luminous efficiency function for human photopic vision specified by the CIE (International Commission on Illumination), and $R(\lambda)$ is a spectral luminous efficiency of insects.

2. A light-emitting device comprising:

a light-emitting element having an emission peak wavelength within a range from 400 nm to 490 nm; and a first phosphor having an emission peak wavelength within a range from 570 nm to 680 nm, wherein the first phosphor includes a first nitride phosphor having a composition represented by Formula (1A), the light-emitting device has a correlated color temperature of 1950 K or less, and a full width at half maximum of an emission peak having a maximum light emission intensity in an emission spectrum of the light-emitting device of 110 nm or less, and the light-emitting device emits light having an insect-attracting index I derived from Equation (1) of 0.031 or less, the insect-attracting index I being a ratio of an effective radiance of the light-emitting device in consideration of spectral luminous efficiency of insects in a range from 250 nm to 615 nm to a luminance of light emitted by the light-emitting device in a range from 380 nm to 780 nm in consideration of spectral luminous efficiency for human photopic vision specified by the CIE (International Commission on Illumination), $$M^1_2Si_5N_8:Eu \quad (1A)$$

where $M^1$ is an alkaline earth metal element including at least one selected from the group consisting of Ca, Sr, and Ba, and $$I = \frac{\int_{250}^{615} S(\lambda) \times R(\lambda) d\lambda}{\int_{380}^{780} S(\lambda) \times V(\lambda) d\lambda} \quad (1)$$

where $S(\lambda)$ is a spectral radiance of light emitted by a light-emitting device, $V(\lambda)$ is a spectral luminous efficiency function for human photopic vision specified by the CIE (International Commission on Illumination), and $R(\lambda)$ is a spectral luminous efficiency of insects.

3. The light-emitting device according to claim 1, wherein the light-emitting device further comprises a second phosphor having an emission peak wavelength within a range from 480 nm to less than 570 nm.

4. The light-emitting device according to claim 2, wherein the light-emitting device further comprises a second phosphor having an emission peak wavelength within a range from 480 nm to less than 570 nm.

5. The light-emitting device according to claim 1, wherein the first phosphor includes at least one selected from the group consisting of a first nitride phosphor having a composition represented by Formula (1A), a second nitride phosphor having a composition represented by Formula (1B), a fluoride phosphor having a composition represented by Formula (1C), and a fluoride phosphor having a composition represented by Formula (1C') with a different composition to that represented by Formula (1C), $$M^1_2Si_5N_8:Eu \quad (1A)$$

where $M^1$ is an alkaline earth metal element including at least one selected from the group consisting of Ca, Sr, and Ba, $$Sr_qCa_sAl_tSi_uN_v:Eu \quad (1B)$$

where q, s, t, u, and v satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$, $$A_c[M^2_{1-b}Mn^{4+}_bF_d] \quad (1C)$$

where A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies $0<b<0.2$, c is an absolute value of electric charge of $[M^2_{1-b}Mn^{4+}_bF_d]$ ion, and d satisfies $5<d<7$, $$A'_{c'}[M^2_{1-b'}Mn^{4+}_{b'}F_{d'}] \quad (1C')$$

where A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies $0<b'<0.2$, c' is an absolute value of electric charge of $[M^2_{1-b'}Mn^{4+}_{b'}F_{d'}]$ ion, and d' satisfies $5<d'<7$.

6. The light-emitting device according to claim 2, wherein the first phosphor further includes at least one selected from the group consisting of a second nitride phosphor having a composition represented by Formula (1B), a fluoride phosphor having a composition represented by Formula (1C), and a fluoride phosphor having a composition represented by Formula (1C') with a different composition to that represented by Formula (1C), $$Sr_qCa_sAl_tSi_uN_v{:}Eu \quad (1B)$$

where q, s, t, u, and v satisfy $0 \le q < 1$, $0 < s \le 1$, $q+s \le 1$, $0.9 \le t \le 1.1$, $0.9 \le u \le 1.1$, and $2.5 \le v \le 3.5$, $$A_c[M^2_{1-b}Mn^{4+}_bF_d] \quad (1C)$$

where A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies $0<b<0.2$, c is an absolute value of electric charge of $[M^2_{1-b}Mn^{4+}_b F_d]$ ion, and d satisfies $5<d<7$, $$A'_{c'}[M^2_{1-b'}Mn^{4+}_{b'}F_{d'}] \quad (1C')$$

where A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies $0<b'<0.2$, c' is an absolute value of electric charge of $$[M^2_{1-b'}Mn^{4+}_{b'}F_{d'}]$$

ion, and d' satisfies $5<d'<7$.

7. The light-emitting device according to claim 1, wherein the first phosphor has a full width at half maximum of an emission peak having an emission peak wavelength in an emission spectrum of the first phosphor within a range from 3 nm to 120 nm.

8. The light-emitting device according to claim 2, wherein the first phosphor has a full width at half maximum of an emission peak having an emission peak wavelength in an emission spectrum of the first phosphor within a range from 3 nm to 120 nm.

9. The light-emitting device according to claim 3, wherein the second phosphor includes at least one selected from the group consisting of a rare earth aluminate phosphor having a composition represented by Formula (2A) and a third nitride phosphor having a composition represented by Formula (2B), $$Ln^1_3(Al_{1-a}Ga_a)_5O_{12}{:}Ce \quad (2A)$$

where $Ln^1$ is at least one element selected from the group consisting of Y, Gd, Tb, and Lu, and a satisfies $0 \le a \le 0.5$, $$La_wLn^2_xSi_6N_y{:}Ce_z \quad (2B)$$

where $Ln^2$ includes at least one selected from the group consisting of Y and Gd and may include at least one selected from the group consisting of Sc and Lu, and when an $Ln^2$ element included in 1 mol of a composition is 100 mol %, a total of Y and Gd included in $Ln^2$ is 90 mol % or greater, and w, x, y, and z satisfy $1.2 \le w \le 2.2$, $0.5 \le x \le 1.2$, $10 \le y \le 12$, $0.5 \le z \le 1.2$, $1.80 < w+x < 2.40$, and $2.9 \le w+x+z \le 3.1$.

10. The light-emitting device according to claim 4, wherein the second phosphor includes at least one selected from the group consisting of a rare earth aluminate phosphor having a composition represented by Formula (2A) and a third nitride phosphor having a composition represented by Formula (2B), $$Ln^1_3(Al_{1-a}Ga_a)_5O_{12}{:}Ce \quad (2A)$$

where $Ln^1$ is at least one element selected from the group consisting of Y, Gd, Tb, and Lu, and a satisfies $0 \le a \le 0.5$, $$La_wLn^2_xSi_6N_y{:}Ce_z \quad (2B)$$

where $Ln^2$ includes at least one selected from the group consisting of Y and Gd and may include at least one selected from the group consisting of Sc and Lu, and when an $Ln^2$ element included in 1 mol of a composition is 100 mol %, a total of Y and Gd included in $Ln^2$ is 90 mol % or greater, and w, x, y, and z satisfy $1.2 \le w \le 2.2$, $0.5 \le x \le 1.2$, $10 \le y \le 12$, $0.5 \le z \le 1.2$, $1.80 < w+x < 2.40$, and $2.9 \le w+x+z \le 3.1$.

11. The light-emitting device according to claim 3, wherein the second phosphor has a full width at half maximum of an emission peak having an emission peak wavelength in an emission spectrum of the second phosphor within a range from 20 nm to 125 nm.

12. The light-emitting device according to claim 4, wherein the second phosphor has a full width at half maximum of an emission peak having an emission peak wavelength in an emission spectrum of the second phosphor within a range from 20 nm to 125 nm.

13. The light-emitting device according to claim 3, wherein a content of the first phosphor relative to a total amount of the first phosphor and the second phosphor is within a range from 5 mass % to 95 mass %.

14. The light-emitting device according to claim 4, wherein a content of the first phosphor relative to a total amount of the first phosphor and the second phosphor is within a range from 5 mass % to 95 mass %.

15. The light-emitting device according to claim 1, wherein the light-emitting device emits light with a color deviation Duv from a black body radiation locus in a range from −0.008 to +0.008.

16. The light-emitting device according to claim 2, wherein the light-emitting device emits light with a color deviation Duv from a black body radiation locus in a range from −0.008 to +0.008.

17. The light-emitting device according to claim 1, wherein the light-emitting device emits light with a second radiance in a range from 650 nm to 750 nm being 50% or less relative to 100% of a first radiance in a range from 400 nm to 750 nm.

18. The light-emitting device according to claim 2, wherein the light-emitting device emits light with a second radiance in a range from 650 nm to 750 nm being 50% or less relative to 100% of a first radiance in a range from 400 nm to 750 nm.

19. A light fixture comprising:

the light-emitting device described in claim 1.

20. A street light comprising:

the light-emitting device described in claim 1.

* * * * *